(12) United States Patent  
Tsujii

(10) Patent No.: US 6,351,836 B1
(45) Date of Patent: Feb. 26, 2002

(54) SEMICONDUCTOR DEVICE WITH BOUNDARY SCANNING CIRCUIT

(75) Inventor: Toshiyuki Tsujii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/176,312

(22) Filed: Oct. 22, 1998

(30) Foreign Application Priority Data

Jun. 8, 1998 (JP) ............................................. 10-159097

(51) Int. Cl.[7] .............................................. G01R 31/28
(52) U.S. Cl. ...................................... 714/727; 714/726
(58) Field of Search ................................ 714/724, 727, 714/726, 729, 742, 732, 733, 736, 740, 744, 734; 324/158.1

(56) References Cited

U.S. PATENT DOCUMENTS

| | | | | |
|---|---|---|---|---|
| 5,440,567 A | * | 8/1995 | Tsukamoto | ................. 714/727 |
| 5,448,575 A | * | 9/1995 | Hashizume | ................. 714/727 |
| 5,457,381 A | * | 10/1995 | Farwell | .................. 324/158.1 |
| 5,640,404 A | * | 6/1997 | Satish | ......................... 714/726 |
| 5,736,849 A | * | 4/1998 | Terayama | ............... 324/158.1 |
| 5,787,098 A | * | 7/1998 | DasGupta et al. | ......... 714/726 |
| 5,825,194 A | * | 10/1998 | Bhuva et al. | ............... 324/763 |
| 5,936,876 A | * | 8/1999 | Sugasawara | .................. 365/51 |
| 6,118,554 A | * | 9/2000 | Horaguchi | .................. 358/474 |

FOREIGN PATENT DOCUMENTS

| | | |
|---|---|---|
| JP | 5-82609 | 4/1993 |
| JP | 7-297244 | 11/1995 |

* cited by examiner

*Primary Examiner*—David Ton
(74) *Attorney, Agent, or Firm*—Oblon, Spivak, McClelland, Maier & Neustadt, P.C.

(57) ABSTRACT

Provided is a semiconductor device capable of performing a function test and a DC test including an output voltage test every time a test jig is sequentially caused to come in contact with pads of the semiconductor device. The semiconductor device comprises a principal plane (2) of a semiconductor substrate, and pads (3) provided on the principal plane (2). The principal plane (2) is provided with four probing areas (PA1) to (PA4) with which the test jig comes in contact. A large number of pads (3) include four sets of driving pads (3ab) for supplying a driving voltage, and four sets of boundary scanning pads (BSP) for performing boundary scan. Even if it comes in contact with any of the probing areas (PA1) to (PA4), the test jig comes in contact with the driving pads (3ab) and the boundary scanning pads (BSP).

29 Claims, 20 Drawing Sheets

F I G. 1 4
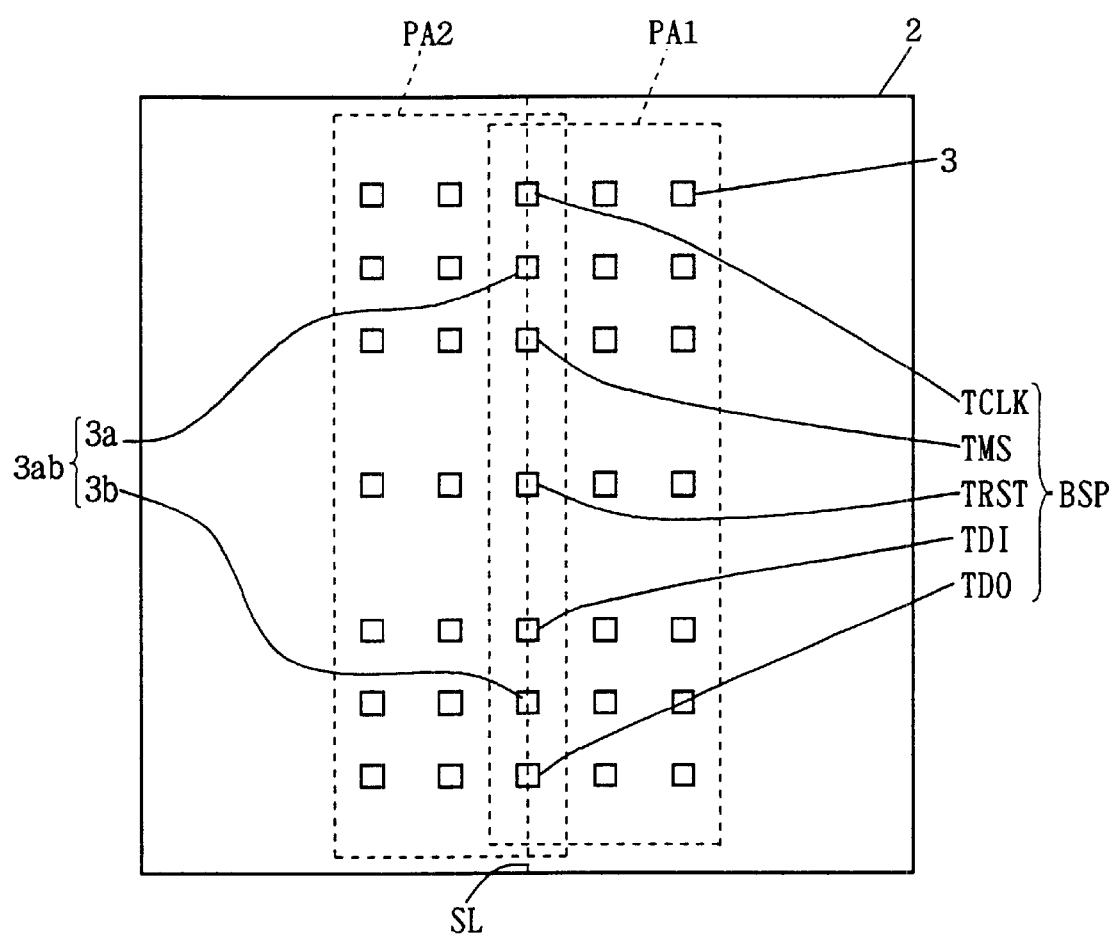

US 6,351,836 B1

SEMICONDUCTOR DEVICE WITH BOUNDARY SCANNING CIRCUIT

BACKGROUND OF THE INVENTION

1. Field of the Invention

The present invention relates to facilitation of a test for a semiconductor device (for example, an LSI).

2. Description of the Background Art

A test for a semiconductor device according to the prior art will be described with reference to FIGS. 19 to 21. FIG. 19 shows a large number of semiconductor devices formed on a wafer 1. The reference numeral 20 denotes a principal plane of a semiconductor substrate of the semiconductor device, and the reference numeral 3 denotes a large. number of pads which are provided on the principal plane 20 of the semiconductor substrate and are conducted to a circuit (not shown) formed on the principal plane 20 of the semiconductor substrate. FIG. 20 shows a probe card 4 (test jig) which is attached to a tester (not shown) and has a probe needle 5 provided thereon. FIG. 21 shows a state in which the probe card 4 of FIG. 20 is in contact with the semiconductor device of FIG. 19.

The test for the semiconductor device includes a function test and a DC test.

The function test is performed by causing the probe needle 5 to come in contact with all the pads 3 provided in the semiconductor device in FIG. 21. In this test, the function of the semiconductor device is inspected.

For example, DC tests other than an output voltage test such as a test for a leak current flowing into a pad to be tested (a test object pad) and a contact test (a conduction test) for the test object pad can be performed by causing the probe needle 5 to come in contact with a power pad and a GND (ground) pad for driving the semiconductor device and the test object pad.

The output voltage test can be performed by causing the probe needle 5 to come in contact with the power pad, the GND pad, the test object pad and a pad (setting pad) for setting a state of the test object pad. In this specification, for example, the output voltage test includes a test (a VOH test or a VOL test) for checking a voltage which is actually output from the test object pad in a state in which the semiconductor device is operated by the setting pad to output an "H" or "L" level from the test object pad, a test (an HI-Z test) for deciding whether or not the test object pad is set to have a desired high impedance by the operation of the semiconductor device with the use of the setting pad, and the like.

According to a technique shown in FIG. 21, the function test and all the DC tests including the output voltage test can be performed. However, the probe needle 5 is caused to come in contact with all the pads 3. For this reason, the probe card 4 having the same number of probe needles 5 as the number of pads 3 is required. As a technique in which a test for a semiconductor device having a large number of pads 3 can be performed by the probe card 4 having a small number of probe needles 5, a boundary scan test has been known.

A test for a semiconductor device using boundary scan according to the prior art will be described with reference to FIGS. 22, 23, 24a, 24b, 24c and 24d. FIGS. 22, 23, 24a, 24b, 24c and 24d correspond to FIGS. 19 to 21, respectively. In FIG. 22, the reference numeral 3a denotes a pad for supplying power to the semiconductor device, the reference numeral 3b denotes a pad for supplying a GND to the semiconductor device, TCLK denotes a pad for inputting a clock signal, TMS denotes a pad for setting a test mode, TDI denotes a pad for inputting serial data, and TDO denotes a pad for outputting the serial data.

The pads 3a and 3b form a set of driving pads 3ab for supplying a driving voltage of the semiconductor device. The pads TCLK, TMS, TDI and TDO form a set of boundary scanning pads BSP for performing the boundary scan test.

A large number of pads provided on the principal plane 20 of the semiconductor substrate are generally referred to as the pads 3. The pads 3 include the boundary scanning pads BSP and the driving pads 3ab.

The boundary scanning pads BSP are not always formed by these four kinds of pads. In some cases, a pad which serves to reset a circuit for performing the boundary scan on an inside of the semiconductor device or the like is added to the boundary scanning pads BSP.

Furthermore, a plurality of pads arranged along a side of the principal plane 20 of the semiconductor substrate is referred to as a pad string.

For the boundary scan, it is sufficient that the probe needle 5 comes in contact with the pads 3a and 3b and the boundary scanning pads BSP. Therefore, even if a small number of probe needles 5 are provided, the function test can be performed.

As shown in FIG. 22, the adjacent pads 3 are provided with an equal space (pad pitch), all the pads forming the boundary scanning pads BSP are included in one pad string of the principal plane 20 of the semiconductor substrate, the pads 3a and 3b are included in each pad string of the principal plane 20 of the semiconductor substrate, and the probe needle 5 is not provided on the probe card 4 corresponding to all the pads 3 of the principal plane 20 of the semiconductor substrate but is provided in only a portion corresponding to one pad string of the principal plane 20 of the semiconductor substrate as shown in FIG. 23. With such structures of the principal plane 20 of the semiconductor substrate and the probe card 4, any of four pad strings of the principal plane 20 of the semiconductor substrate which includes the boundary scanning pads BSP is first caused to come in contact with the probe needle 5 so that the function test and the DC test including the output voltage test for each pad 3 with which the probe needle 5 is in contact can be performed (FIG. 24a), and the principal plane 20 of the semiconductor substrate is then rotated by 90 degrees so that the DC tests other than the output voltage test for each pad 3 can be performed for three residual pad strings (FIGS. 24b to 24d).

Referring to FIGS. 24b, 24c and 24d, however, the probe needle 5 does not come in contact with the boundary scanning pads BSP. Therefore, the output voltage test using the boundary scanning pads BSP as setting pads cannot be performed for the three residual pad strings. Consequently, the test is incompletely performed.

SUMMARY OF THE INVENTION

A first aspect of the present invention is directed to a semiconductor device comprising a semiconductor substrate provided with a boundary scan test circuit having an I/O pad selecting function, and a large number of pads provided on a principal plane of the semiconductor substrate and conducted to a boundary scan test circuit having the I/O pad selecting function, the principal plane of the semiconductor substrate having a plurality of areas with which a test jig comes in contact, the pads including at least one set of driving pads for supplying a driving voltage of the semi-conductor device, and at least one set of boundary scanning pads for performing a boundary scan test, and the at least one set of driving pads and the at least one set of boundary scanning pads being placed in positions where the test jig can come in contact with any of the areas.

A second aspect of the present invention is directed to the semiconductor device, wherein plural sets of driving pads are provided corresponding to the areas and are included in the respective areas, and plural sets of boundary scanning pads are provided corresponding to the areas and are included in the respective areas.

A third aspect of the present invention is directed to the semiconductor device, wherein the pads included in each of the areas are arranged along a side of the principal plane of the semiconductor substrate.

A fourth aspect of the present invention is directed to the semiconductor device, wherein the areas have a common region to be used for all of them in common, and the one set of boundary scanning pads are included in the common region.

A fifth aspect of the present invention is directed to the semiconductor device, wherein the areas are four areas obtained by virtually dividing the principal plane of the semiconductor substrate by two orthogonal segments, the common region includes a region on the two orthogonal segments, and the one set of boundary scanning pads is placed in positions on the two orthogonal segments at equal distances from an intersection of the two orthogonal segments.

A sixth aspect of the present invention is directed to the semiconductor device, wherein the common region further includes at least one region on two other orthogonal segments whose intersection is positioned on the intersection of the two orthogonal segments, and the at least one set of driving pads is placed in positions on the other two orthogonal segments at equal distances from the intersection.

A seventh aspect of the present invention is directed to the semiconductor device, wherein the areas are two areas obtained by virtually dividing the principal plane of the semiconductor substrate by one segment, and the common region includes a region on the one segment.

An eighth aspect of the present invention is directed to the semiconductor device, wherein the one set of boundary scanning pads is placed on the one segment which is symmetrical with respect to a predetermined point on the one segment.

A ninth aspect of the present invention is directed to the semiconductor device, wherein the areas are two areas obtained by virtually dividing the principal plane of the semiconductor substrate by one segment, the common region includes a region on two orthogonal segments whose intersection is positioned on the one segment, and the one set of boundary scanning pads is placed in positions on the two orthogonal segments at equal distances from the intersection of the two orthogonal segments.

A tenth aspect of the present invention is directed to the semiconductor device, wherein the at least one set of driving pads is included in the common region.

An eleventh aspect of the present invention is directed to the semiconductor device, wherein the plural sets of boundary scanning pads are placed in identical positions in the areas.

A twelfth aspect of the present invention is directed to the semiconductor device, wherein plural sets of driving pads are provided corresponding to the areas, and are included in the respective areas, and the plural sets of driving pads are placed in identical positions in the areas.

A thirteenth aspect of the present invention is directed to the semiconductor device, wherein the boundary scan test circuit having an I/O pad selecting function includes a boundary scanning circuit for performing the boundary scan, and a selector for conducting, to the boundary scanning circuit, any of the plural sets of boundary scanning pads with which the test jig is in contact.

A fourteenth aspect of the present invention is directed to the semiconductor device, wherein one pad included in the one set of boundary scanning pads is placed on the intersection.

A fifteenth aspect of the present invention is directed to the semiconductor device, wherein the pads further include a dummy pad for making arrangements of the pads identical to each other in the areas.

According to the first aspect of the present invention, the test jig is in contact with the driving pads and the boundary scanning pads in the test for each area. Therefore, a function test and a DC test including an output voltage test can be performed completely.

According to the second aspect of the present invention, the driving pads and the boundary scanning pads are included in the respective areas so that the first aspect of the present invention can be realized.

According to the third aspect of the present invention, the present invention can be applied to a semiconductor device in which a principal plane of a semiconductor substrate is a quadrilateral and pads are arranged on a straight line along a side of the principal plane of the semiconductor substrate, for example.

According to the fourth aspect of the present invention, a set of boundary scanning pads is included in the common region. Consequently, it is sufficient that a set of boundary scanning pads is provided on the principal plane of the semiconductor substrate. Thus, the number of the boundary scanning pads can be reduced.

According to the fifth aspect of the present invention, the arrangement of the boundary scanning pads is not changed before and after the principal plane of the semiconductor substrate is rotated by 90 degrees around the intersection of the two orthogonal segments. Therefore, the principal plane of the semiconductor substrate is rotated by 90 degrees around the intersection so that the test jig can be caused to come in contact with the boundary scanning pads in the test, for example.

According to the sixth aspect of the present invention, the arrangement of the pads is not changed before and after the principal plane of the semiconductor substrate is rotated by 90 degrees around the intersection of the two orthogonal segments and the driving pads can be placed on other two orthogonal segments. Therefore, the present invention is effective in a case where the boundary scanning pads and the driving pads cannot be placed on a set of two orthogonal segments.

According to the seventh aspect of the present invention, the principal plane of the semiconductor substrate is moved from one of the areas toward other areas so that the test jig can be caused to come in contact with the boundary scanning pads in the test, for example.

According to the eighth aspect of the present invention, the arrangement of the boundary scanning pads is not changed before and after the principal plane of the semiconductor substrate is rotated by 180 degrees around a certain point on one segment. Therefore, the principal plane of the semiconductor substrate is rotated by 180 degrees around the certain point so that the test jig can be caused to come in contact with the boundary scanning pads in the test, for example.

According to the ninth aspect of the present invention, the arrangement of the boundary scanning pads is not changed before and after the principal plane of the semiconductor substrate is rotated by 180 degrees around the intersection of the two orthogonal segments. Therefore, the principal plane of the semiconductor substrate is rotated by 180 degrees around the intersection so that the test jig can be caused to come in contact with the boundary scanning pads in the test, for example.

According to the tenth aspect of the present invention, the number of the driving pads can be reduced.

According to the eleventh aspect of the present invention, a part of a program can be shared in the test for each area. Therefore, development man-days of the program can be reduced.

According to the twelfth aspect of the present invention, the test jig can cope with a semiconductor device which requires greater power.

According to the thirteenth aspect of the present invention, input and output of a probing boundary scanning pads can be made effective.

According to the fourteenth aspect of the present invention, even if one set of boundary scanning pads includes five pads, for example, one of them is placed on the intersection so that the arrangement of the boundary scanning pads is not changed before and after the principal plane of the semiconductor substrate is rotated by 90 degrees around the intersection.

According to the fifteenth aspect of the present invention, the test jig can be prevented from damaging the principal plane of the semiconductor substrate other than the pads.

In order to solve the above-mentioned problem, it is an object of the present invention to provide a semiconductor device capable of performing an output voltage test for all I/O pads and output pads by using a probe card having probe needles whose number is smaller than that of the pads of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a plan view showing an example of a semiconductor device according to a tenth embodiment of the present invention;

DESCRIPTION OF THE PREFERRED EMBODIMENTS

First Embodiment

Figure 1:
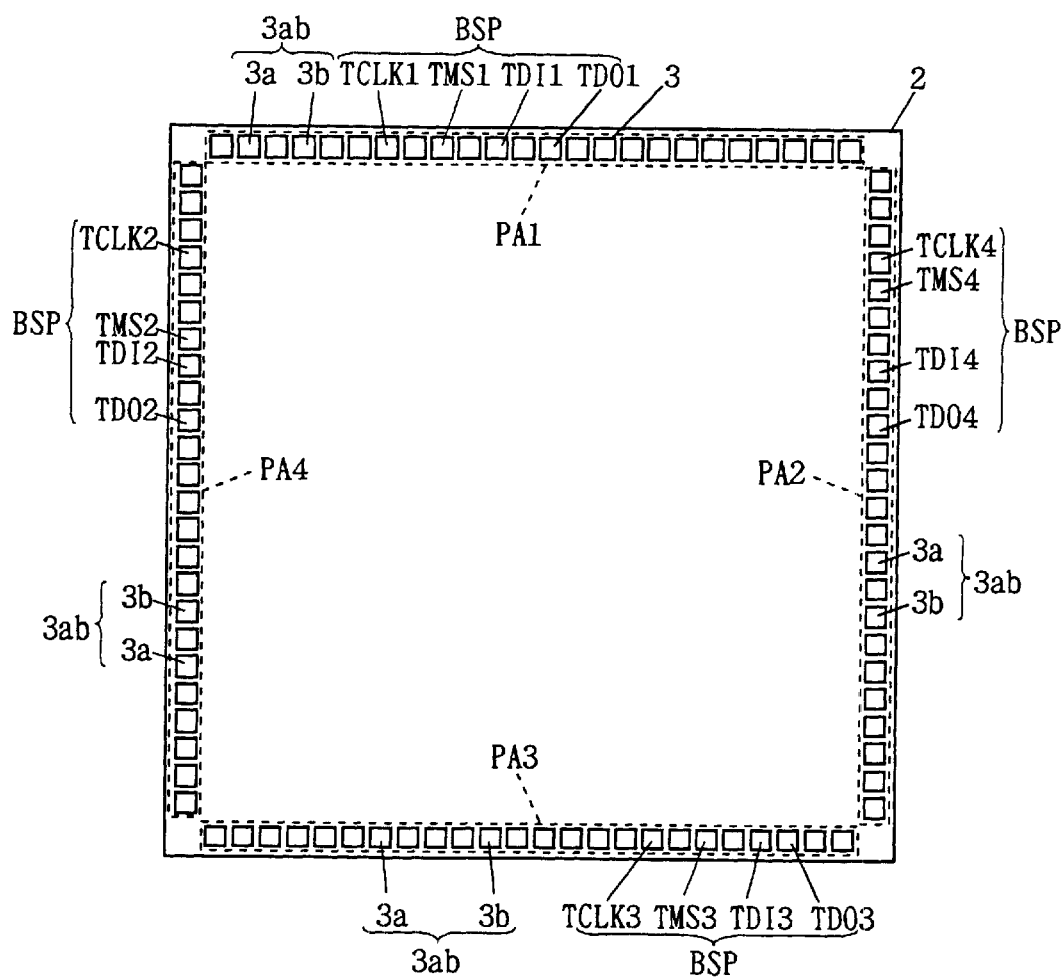
FIG. 1 is a plan view showing an example of a semiconductor device according to a first embodiment of the present invention.

FIG. 1 is a plan view showing a semiconductor device according to a first embodiment of the present invention. In FIG. 1, the reference numeral 2 denotes a principal plane of a semiconductor substrate of a semiconductor device in which a boundary scan test circuit having an I/O pad selecting function is provided, PA1 to PA4 denote probing areas which are provided on the principal plane 2 of the semiconductor substrate and with which a probe card (test jig) attached to a tester comes in contact respectively, and the reference numeral 3 denotes a large number of pads provided on the principal plane 2 of the semiconductor substrate.

Pads 3, 3a, 3b, TCLK, TMS, TDI and TDO, boundary scanning pads BSP, and driving pads 3ab are the same as in the Description of the Background Art.

In FIG. 1, four sets of driving pads 3ab and boundary scanning pads BSP are provided corresponding to the probing areas PA1 to PA4 respectively, and are included in the respective probing areas PA1 to PA4. The principal plane 2 of the semiconductor substrate is a quadrilateral. A plurality of pads 3 in each of the probing areas PA1 to PA4 are arranged on a straight line along a side of the principal plane 2 of the semiconductor substrate. All spaces (pad pitches) between the adjacent pads 3 on the principal plane 2 of the semiconductor substrate are identical. Furthermore, the number of the pads 3 is the same in the probing areas PA1 to PA4.

Figure 2:
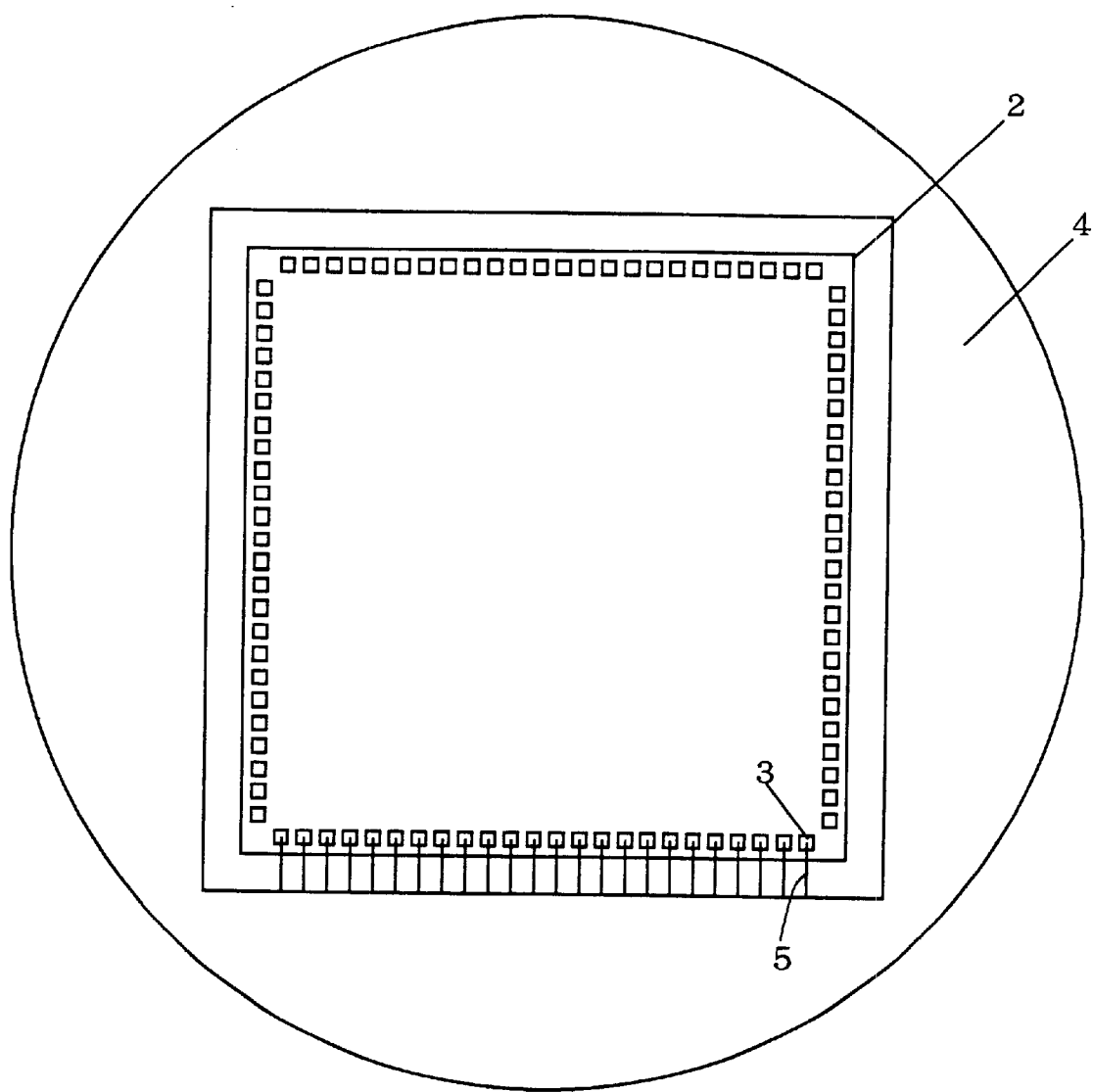
FIG. 2 is a view showing an example of a state in which a probe card is in contact with the semiconductor device in FIG. 1.
Figure 23:
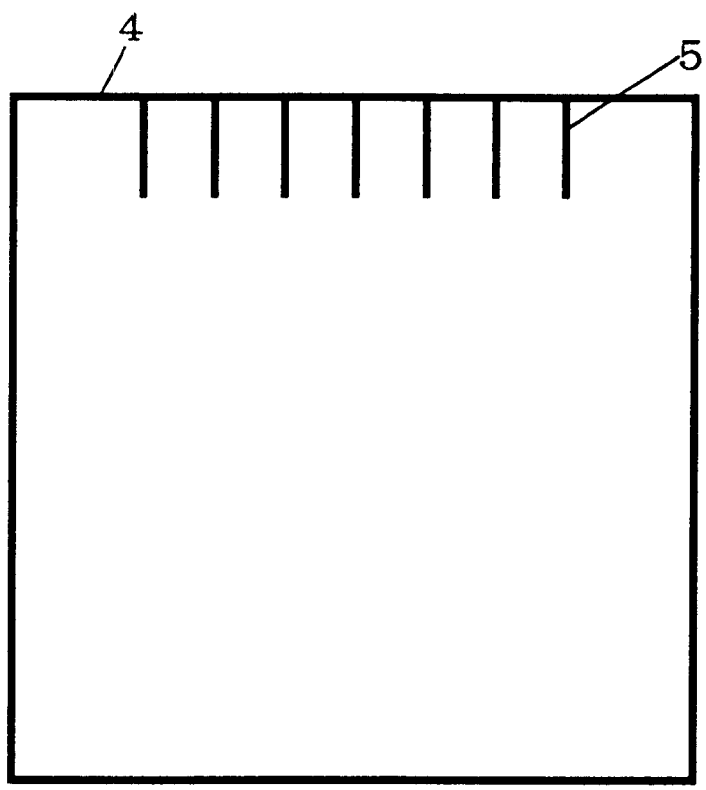
FIG. 23 is a view showing an example of the probe card according to the prior art.
Figure 24A:
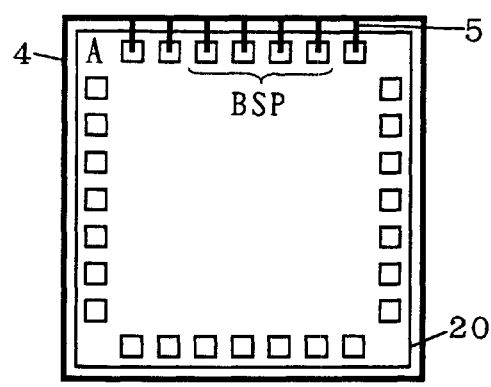
FIGS. 24a, 24b, 24c and 24d are views showing examples of a state in which the probe card is in contact with the semiconductor device according to the prior art, respectively.
Figure 24B:
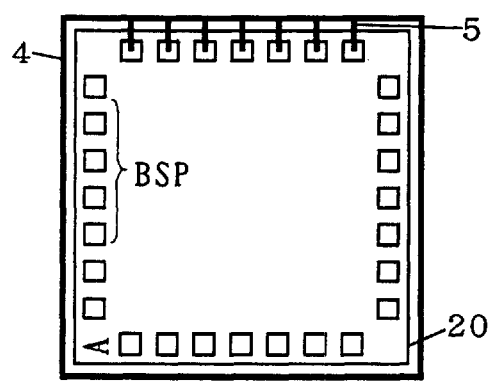
Figure 24C:
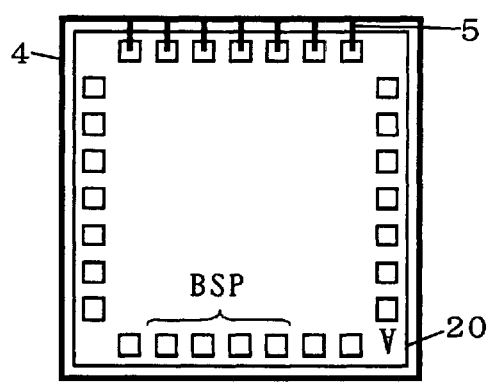
Figure 24D:
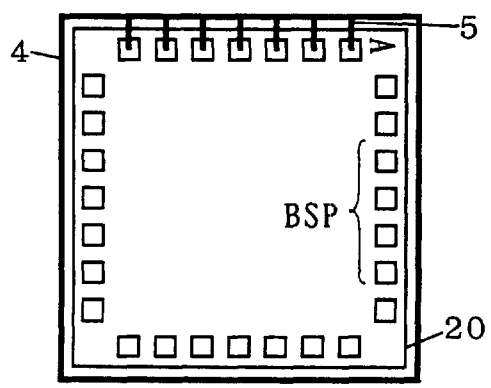

FIG. 2 is a view showing a state in which a probe card is in contact with the semiconductor device in FIG. 1. Each reference numeral in FIG. 2 corresponds to each reference numeral in FIGS. 1 and 23. In FIG. 2, a tip of a probe needle 5 is arranged on a straight line, and a space (probe pitch) between the tips of the adjacent probe needles 5 is equal to the pad pitch. The number of the probe needles 5 is equal to that of the pads 3 in each probing area. By using a probe card 4 shown in FIG. 2, a tip of the probe needle 5 comes in contact with all the pads 3 in each probing area.

Figure 3:
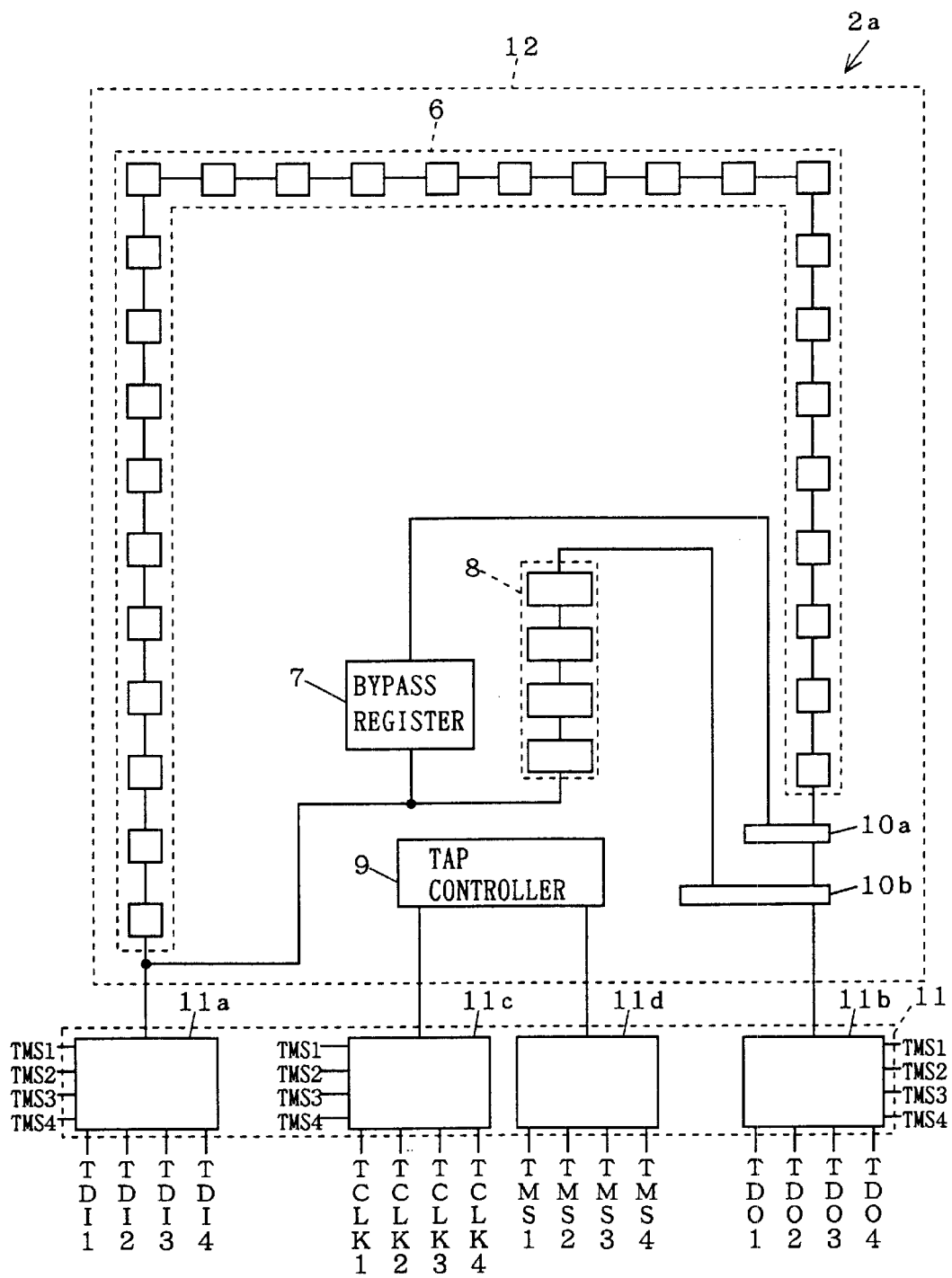
FIG. 3 is a circuit diagram showing a part of an example of a boundary scan test circuit having an I/O pad selecting function according to the first embodiment of the present invention.

FIG. 3 is a circuit diagram showing a part of an example of the boundary scan test circuit having an I/O pad selecting function according to the first embodiment of the present invention. In FIG. 3, the reference numeral 2a denotes the boundary scan test circuit having an I/O pad selecting function.

The boundary scan test circuit 2a having an I/O pad selecting function comprises a boundary scanning circuit 12 for performing boundary scan, and a selector 11 for conducting, to the boundary scanning circuit 12, any of the four sets of boundary scanning pads BSP with which the probe card 4 is in contact.

The selector 11 includes selectors 11a, 11b, 11c and 11d. The boundary scanning circuit 12 includes a boundary scan register 6, a bypass register 7, an instruction register 8, a TAP controller 9, a selector 10a and a selector 10b.

First of all, the selector 11a of the selector 11 selects any of pads TDI1 to TDI4 which is indicated by a signal of each of pads TMS1 to TMS4, and causes the same pad to be conducted to an input terminal of the boundary scan register 6, the bypass register 7 or the instruction register 8.

The selector 11b selects any of pads TDO1 to TDO4 which is indicated by the signal of each of the pads TMS1 to TMS4, and causes the same pad to be conducted to an output terminal of the selector 10b. The selector 11c selects any of pads TCLK1 to TCLK4 which is indicated by the signal of each of the pads TMS1 to TMS4, and causes the same pad to be conducted to one of input terminals of the TAP controller 9. The selector 11d sends a signal provided to any of the pads TMS1 to TMS4 to the other input terminal of the TAP controller 9.

The selector 11 can cause any of the four sets of boundary scanning pads BSP with which the probe card 4 is in contact to be conducted to the boundary scanning circuit 12 in the following manner. For example, in a case where the probe card 4 is in contact with the boundary scanning pads BSP in the probing area PA1, a signal indicative of the probing area PA1 is sent from the probe card 4 to the pad TMS1. Consequently, the selectors 11a, 11b and 11c select the pads TDI1, TDO1 and TCLK1 to be conducted to the boundary scanning circuit 12, respectively.

Secondly, the well-known boundary scanning circuit 12 is applied. The TAP controller 9 controls the boundary scan register 6, the bypass register 7, the instruction register 8, the selector 10a and the selector 10b in response to signals sent from the selectors 11c and 11d and an instruction stored in the instruction register 8. The boundary scan register 6 is a kind of shift register formed by a plurality of registers which are connected in series, and serves to output data from the selector 11a to each functional block (not shown) which is formed on the same principal plane 2 of the semiconductor substrate and to output data from the functional block to the selector 10a in response to the control of the TAP controller 9. The bypass register 7 bypasses a signal output from the selector 11a to the selector 10a by the control of the TAP controller 9 if necessary. The selector 10a selects data sent from the boundary scan register 6 or the bypass register 7, and outputs the same data to the selector 10b in response to the control of the TAP controller 9. The selector 10b selects data sent from the selector 10a or the instruction register 8, and outputs the same data to the selector 11b in response to the control of the TAP controller 9.

Next, a method for testing the semiconductor device shown in FIG. 1 will be described. A tester to which the probe card 4 shown in FIG. 2 is attached is used for testing the semiconductor device shown in FIG. 1.

First of all, the probe card 4 is caused to come in contact with the probing area PA1. At this time, the tip of the probe needle 5 is in contact with all the pads 3 in the probing area PA1.

Since the tip of the probe needle 5 is in contact with the driving pads 3ab, the boundary scanning pads BSP and the pads 3 to be tested, the tester then performs a function test and a DC test including an output voltage test for each pad 3 on this side according to a program.

When each test for the probing area PA1 is completed, the principal plane 2 of the semiconductor substrate is rotated by 90 degrees to perform the test for the probing areas PA2 to PA4 in the same manner as in the probing area PA1, for example. If the function test for the probing area PA1 is enough, for example, it is not necessary to perform the function test for the probing areas PA2 to PA4.

The first embodiment has the following effect. Since the boundary scanning circuit can be operated in the test for each probing area, an output voltage of the probing area can be set and the output voltage test for all the probing areas which could not be performed in the prior art can be executed.

Second Embodiment

Figure 4:
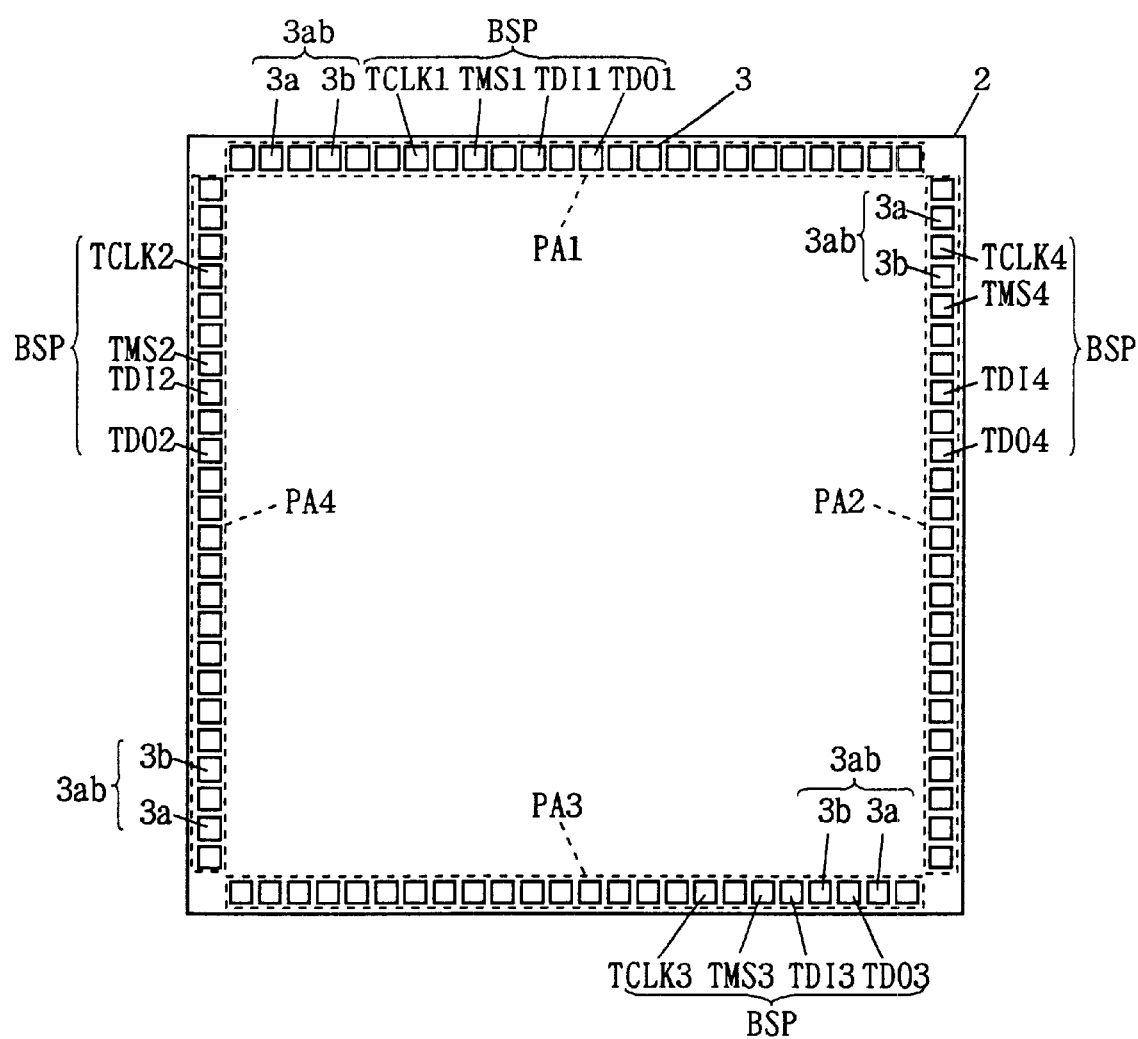
FIG. 4 is a plan view showing an example of a semiconductor device according to a second embodiment of the present invention.

FIG. 4 is a plan view showing a semiconductor device according to a second embodiment of the present invention. The reference numerals in FIG. 4 correspond to those in FIG. 1.

While positions of the driving pads 3ab and the boundary scanning pads BSP are optional in FIG. 1, the driving pads 3ab are placed in identical positions in the probing areas PA1 to PA4 in FIG. 4.

The second embodiment has the following effect in addition to the effect of the first embodiment. Since the driving pads 3ab are placed in the identical positions in the probing areas PA1 to PA4, specific probe needles 5 (second and fourth probe needles from an end in FIG. 4) can be caused to come in contact with the driving pads 3ab in a test for each probing area. In FIG. 1, a dedicated driver for generating a tester signal is connected to all the probe needles 5 of the probe card 4 to supply a driving voltage and GND. For this reason, if the semiconductor device consumes great power, the driver cannot supply necessary power so that the semiconductor device cannot be operated normally. In FIG. 4, since positions of supply of the driving voltage and GND are specified, a device power source of the tester can be used for supplying the driving voltage. Thus, the second embodiment can cope with a semiconductor device having greater power consumption.

Third Embodiment

Figure 5:
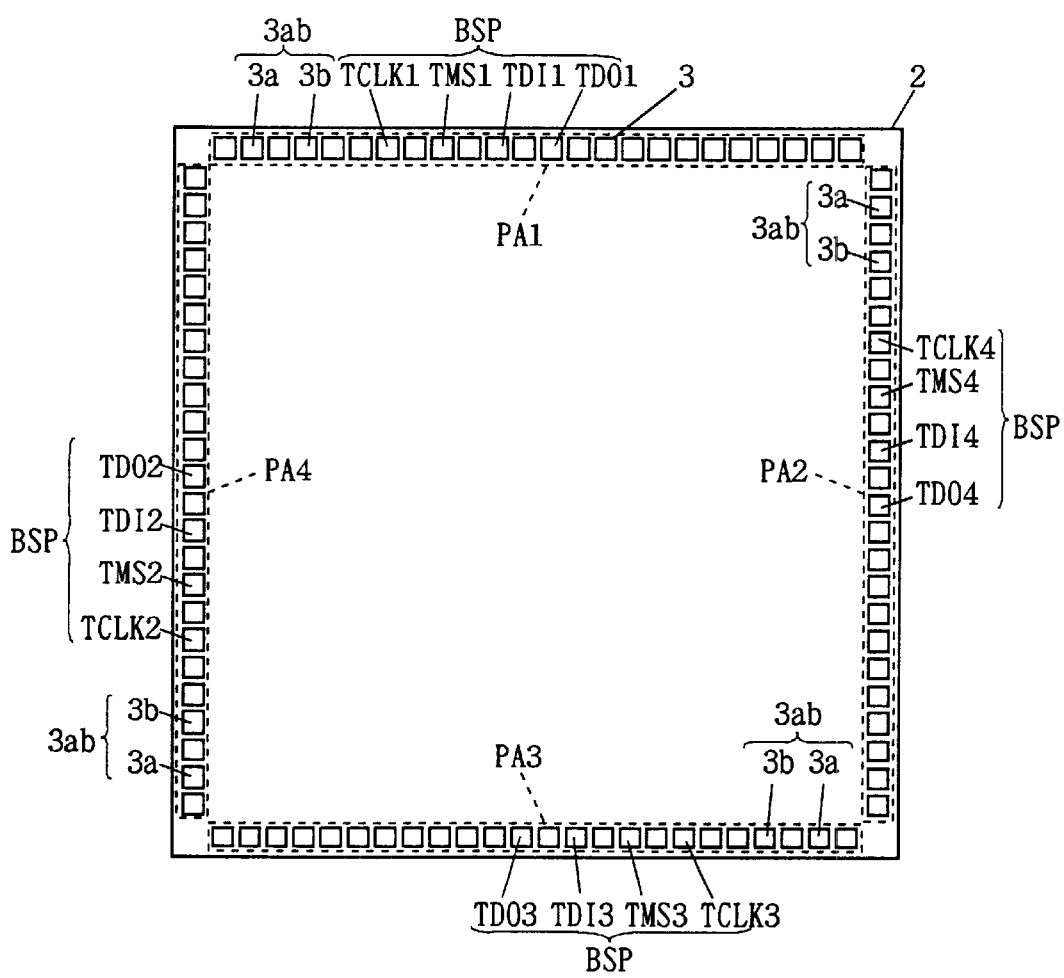
FIG. 5 is a plan view showing an example of a semiconductor device according to a third embodiment of the present invention.

FIG. 5 is a plan view showing a semiconductor device according to a third embodiment of the present invention. The reference numerals in FIG. 5 correspond to those in FIG. 1.

In FIG. 5, driving pads 3ab and boundary scanning pads BSP are placed in identical positions in probing areas PA1 to PA4.

The third embodiment has the following effect in addition to the effects of the first and second embodiments. Since the driving pads 3ab and the boundary scanning pads BSP are placed in the identical positions in the probing areas PA1 to PA4, they come in contact with specific probe needles 5. Accordingly, a tester can share a part of a program in a test for each probing area. Therefore, development man-days of the program can be reduced, for example.

Fourth Embodiment

In the first to third embodiments, a plurality of pads 3 in each of the probing areas PA1 to PA4 does not always need to be arranged on a straight line along a side of the principal plane 2 of the semiconductor substrate.

Figure 6:
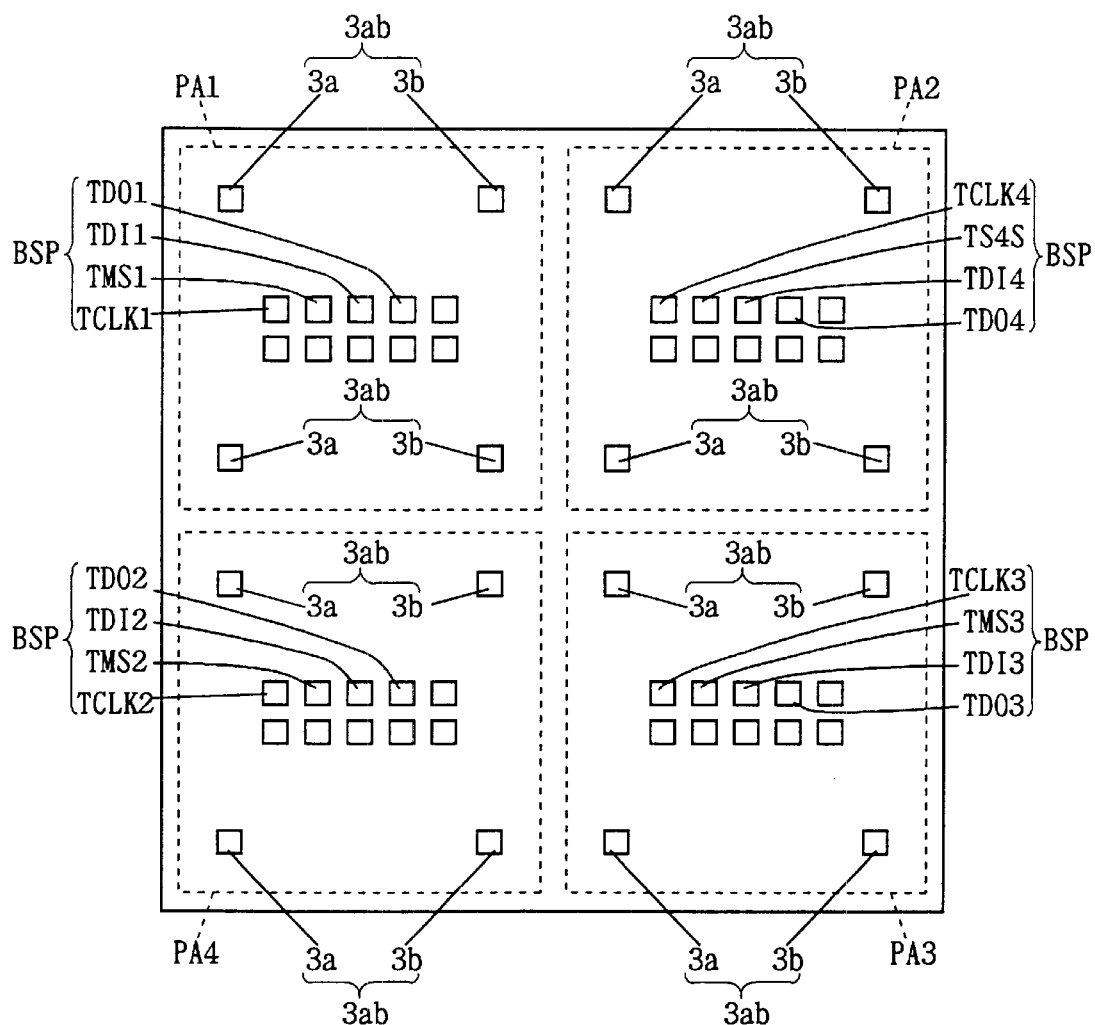
FIG. 6 is a plan view showing an example of a semiconductor device according to a fourth embodiment of the present invention.
Figure 7:
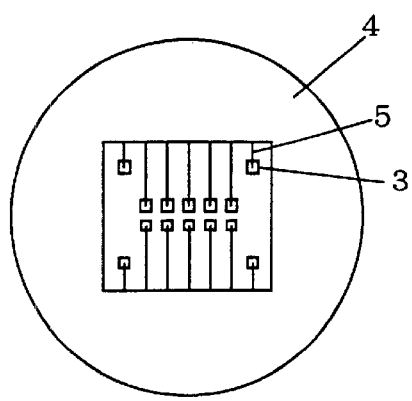
FIG. 7 is a view showing an example of a state in which a probe card is in contact with the semiconductor device in FIG. 6.

For example, the pads 3 may be provided over the principal plane 2 of the semiconductor substrate as shown in FIG. 6. As shown in FIG. 7, a probe card is in contact with the semiconductor device in FIG. 6.

Fifth Embodiment

Figure 8:
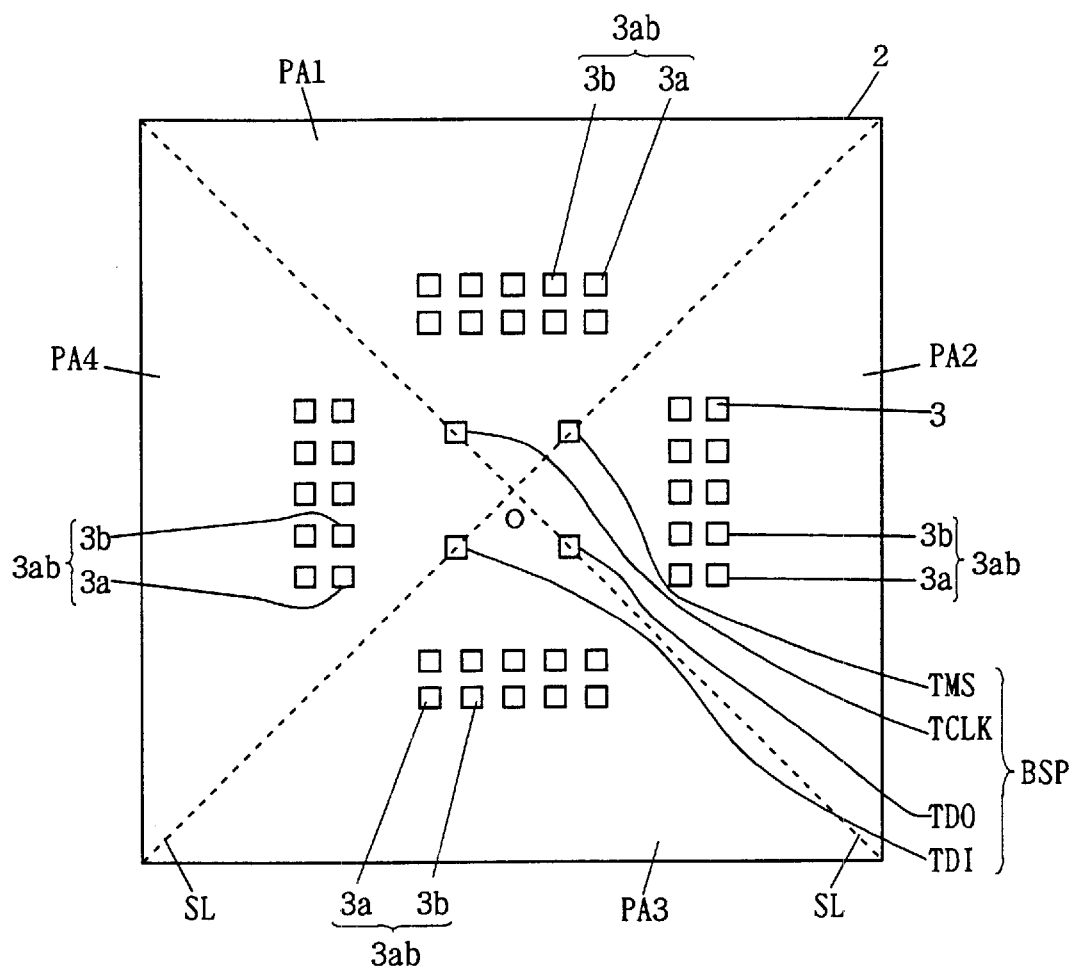
FIG. 8 is a plan view showing an example of a semiconductor device according to a fifth embodiment of the present invention.

FIG. 8 is a plan view showing a semiconductor device according to a fifth embodiment of the present invention. In FIG. 8, SL denotes a virtual segment, O denotes an intersection of two segments SL and other reference numerals correspond to those in FIG. 1.

In FIG. 8, a principal plane 2 of a semiconductor substrate is a square. The two segments SL are diagonal lines of the principal plane 2 of the semiconductor substrate, and are orthogonal to each other. The two segments which are orthogonal to each other will be hereinafter referred to as two orthogonal segments. The intersection O also acts as a center of the principal plane 2 of the semiconductor substrate. Probing areas PA1 to PA4 virtually divide the principal plane 2 of the semiconductor substrate by the two orthogonal segments SL. A region (common region) on the two orthogonal segments SL is used for the probing areas PA1 to PA4 in common. Pads TMS, TCLK, TDO and TDI are placed symmetrically with respect to the intersection O in positions on the two orthogonal segments SL at equal distances from the intersection O, respectively. Other pads 3 which are not provided on the two orthogonal segments SL are also placed symmetrically with respect to the intersection O. According to the arrangement of the pads 3, if the principal plane 2 of the semiconductor substrate is rotated by 90 degrees around the intersection O, the pads 3 overlap with each other. Therefore, the arrangement of the pads 3 is not changed before and after the principal plane 2 of the semiconductor substrate is rotated by 90 degrees.

Figure 9:
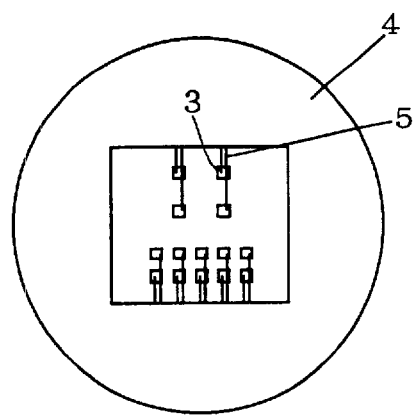
FIG. 9 is a view showing an example of a state in which a probe card is in contact with the semiconductor device in FIG. 8.

FIG. 9 is a view showing an example of a state in which a probe card is in contact with the semiconductor device shown in FIG. 8. By using a probe card 4 shown in FIG. 9, a tip of a probe needle 5 can sequentially come in contact with all the pads 3 in the probing areas PA1 to PA4 by rotation.

In FIG. 8, furthermore, four sets of driving pads 3ab are provided corresponding to the probing areas PA1 to PA4 and are included in the respective probing areas PA1 to PA4. Consequently, even if the probe card 4 is caused to come in contact with any of the probing areas PA1 to PA4, the tip of the probe needle 5 always comes in contact with the driving pads 3ab and boundary scanning pads BSP.

Preferably, a method for testing the semiconductor device shown in FIG. 8 is performed by rotating the principal plane 2 of the semiconductor substrate by 90 degrees around the intersection O as described in the first embodiment, for example.

The fifth embodiment has the following effect. In a test for each probing area, the tip of the probe needle 5 is in contact with the driving pads 3ab, the boundary scanning pads BSP and the pads 3 to be tested. Therefore, a function test and a DC test including an output voltage test can be performed completely.

Before and after the principal plane 2 of the semiconductor substrate is rotated by 90 degrees around the intersection O, the arrangement of the boundary scanning pads BSP is not changed. Therefore, the probe card 4 can be caused to come in contact with the boundary scanning pads BSP by rotating the principal plane 2 of the semiconductor substrate by 90 degrees around the intersection O in the test, for example.

A set of boundary scanning pads BSP are included in the common region. Consequently, it is sufficient that a set of boundary scanning pads BSP are provided on the principal plane 2 of the semiconductor substrate. For example, the number of the boundary scanning pads BSP can be reduced as compared with the first embodiment.

Furthermore, if a set of boundary scanning pads BSP are provided, the selector 11 shown in FIG. 3 can be omitted, for example.

Sixth Embodiment

Figure 10:
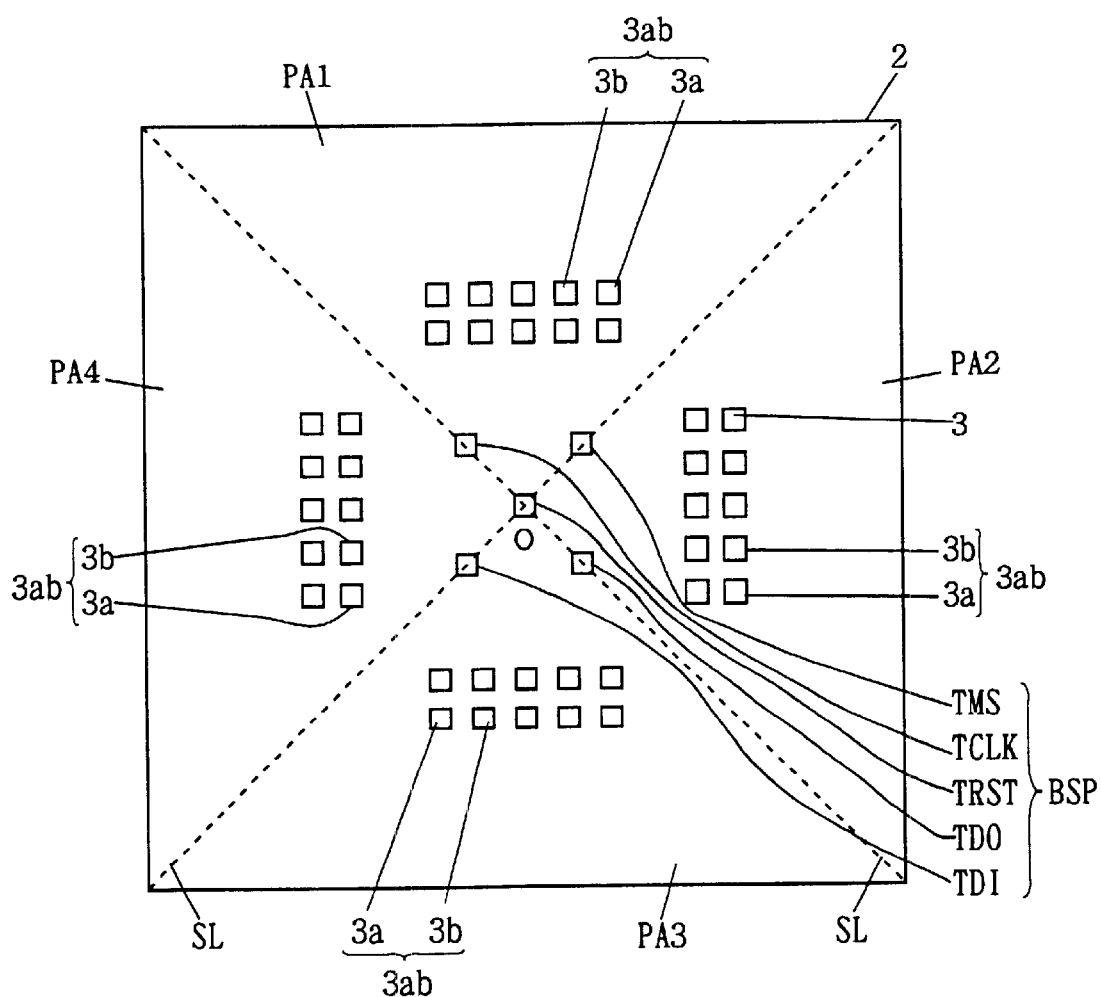
FIG. 10 is a plan view showing an example of a semiconductor device according to a sixth embodiment of the present invention.

FIG. 10 is a plan view showing a semiconductor device according to a sixth embodiment of the present invention. FIG. 10 is obtained by adding, to FIG. 9, a pad TRST for resetting a boundary scanning circuit 12. A set of boundary scanning pads BSP include five pads 3.

One of the five pads 3 included in a set of boundary scanning pads BSP is provided on an intersection O. FIG. 10 shows a case in which the pad TRST is provided on the intersection O as an example.

The sixth embodiment has the following effect in addition to the effect of the fifth embodiment. For example, even if five pads 3 are included in a set of boundary scanning pads BSP, one of them is provided on the intersection O so that an arrangement of the pads 3 is not changed before and after a principal plane 2 of a semiconductor substrate is rotated by 90 degrees around the intersection O.

Seventh Embodiment

Figure 11:
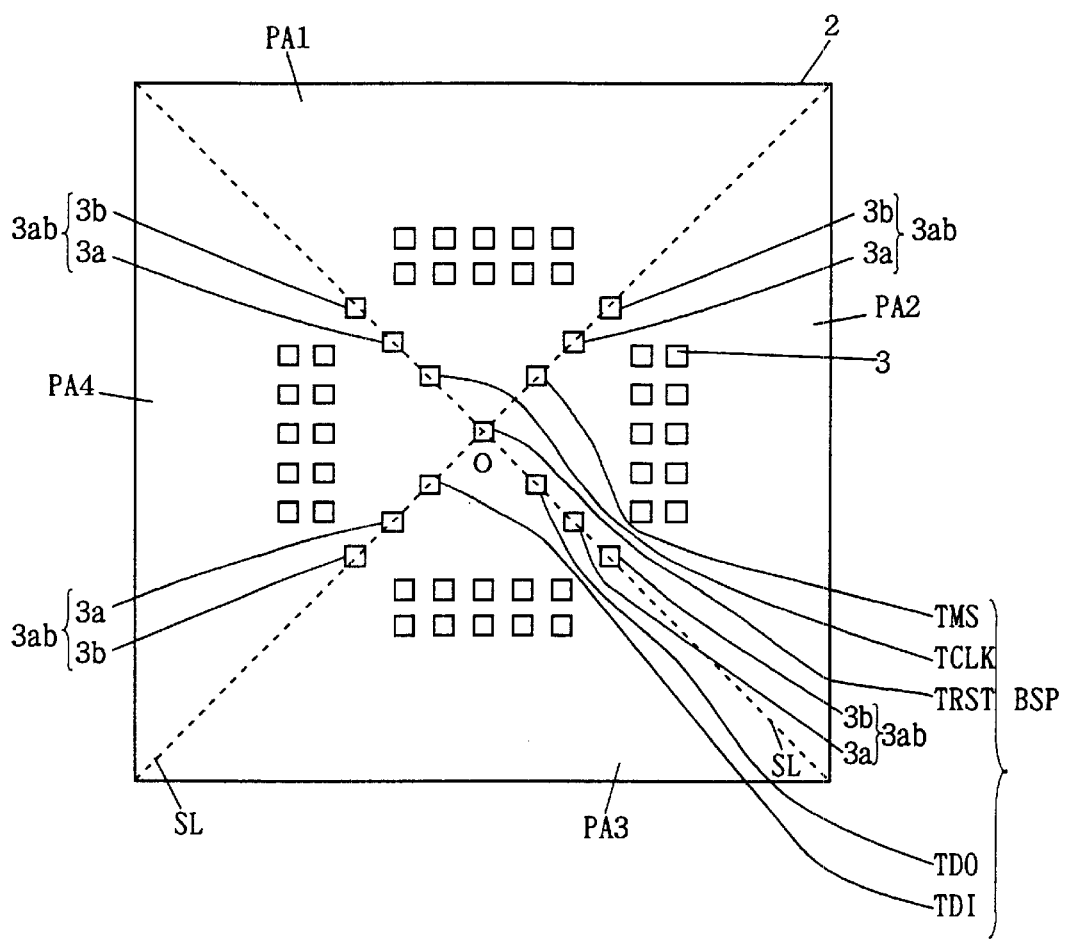
FIG. 11 is a plan view showing an example of a semiconductor device according to a seventh embodiment of the present invention.

FIG. 11 is a plan view showing a semiconductor device according to a seventh embodiment of the present invention.

In FIG. 11, a large number of pads 3 includes four sets of driving pads 3ab. Four pads 3a are placed symmetrically with respect to an intersection O in positions on two orthogonal segments SL at equal distances from the intersection O, respectively. Similarly, four pads 3b are placed symmetrically with respect to the intersection O in positions on the two orthogonal segments SL at equal distances from the intersection O, respectively. The driving pads 3ab are not provided in positions other than the positions on the two orthogonal segments SL. Others shown in FIG. 11 are the same as in FIG. 10.

It is sufficient that the number of sets of the driving pads 3ab included in common regions (regions on the two orthogonal segments SL) is a multiple of 4.

In addition to the effect of the sixth embodiment, the seventh embodiment has an effect that is effective in a case where the kind of a driving voltage of the semiconductor device is not restricted. For example, it is assumed that four kinds of driving voltages are required to drive the semiconductor device. In FIG. 11, if a probe card 4 is formed in such a manner that the four sets of driving pads 3ab on the two orthogonal segments SL come in contact with a tip of a probe needle 5 in a test for each probing area, for example, the four sets of driving pads 3ab are enough. In a case where the driving pads 3ab are not provided on the two orthogonal segments SL (common regions) but plural sets of driving pads 3ab are provided corresponding to probing areas PA1 to PA4, 16 sets (=4×4) of driving pads 3ab are required. Thus, the driving pads 3ab are provided in the common regions so that the number thereof can be reduced.

Eighth Embodiment

Figure 12:
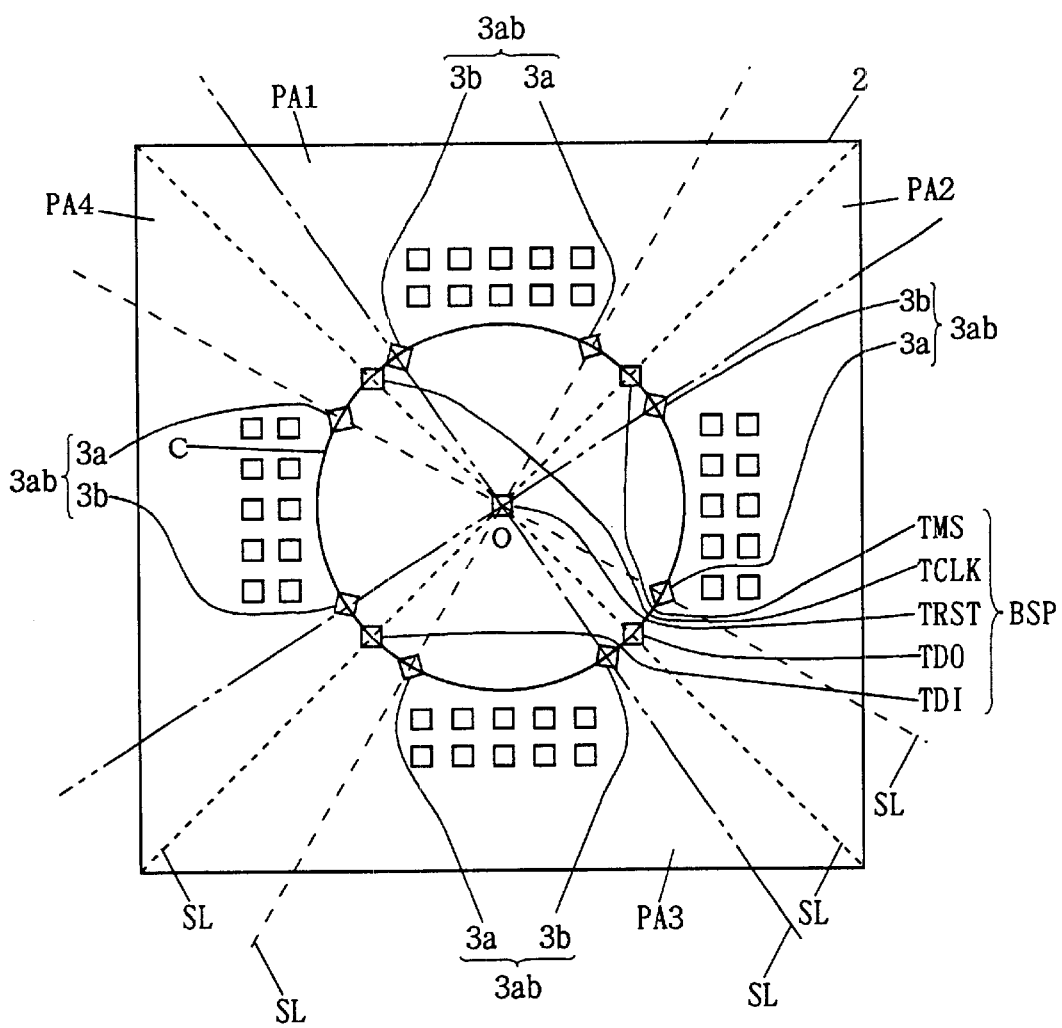
FIG. 12 is a plan view showing an example of a semiconductor device according to an eighth embodiment of the present invention.

FIG. 12 is a plan view showing a semiconductor device according to an eighth embodiment of the present invention.

FIG. 12 is obtained by further adding, to FIG. 11, two sets of two orthogonal segments SL which are orthogonal to each other and have intersections positioned on an intersection O and by moving four sets of driving pads 3ab onto the added two sets of two orthogonal segments SL. A region on the added two sets of two orthogonal segments SL are included in a common region. In FIG. 12, a set of boundary scanning pads BSP and the four sets of driving pads 3ab are placed except for a pad TRST symmetrically with respect to the intersection O respectively, and are placed on intersections of three sets of two orthogonal segments SL and a virtual circle C having the intersection O as a center, that is, in positions on the three sets of two orthogonal segments SL at equal distances from the intersection 0. Similarly, the arrangement of the pads 3 is not changed before and after a principal plane 2 of a semiconductor substrate is rotated by 90 degrees around the intersection O.

In addition to the effect of the seventh embodiment, the effect of the eighth embodiment is effective in a case where it is hard to place the boundary scanning pads BSP and the driving pads 3ab on a set of two orthogonal segments SL.

Ninth Embodiment

Figure 13:
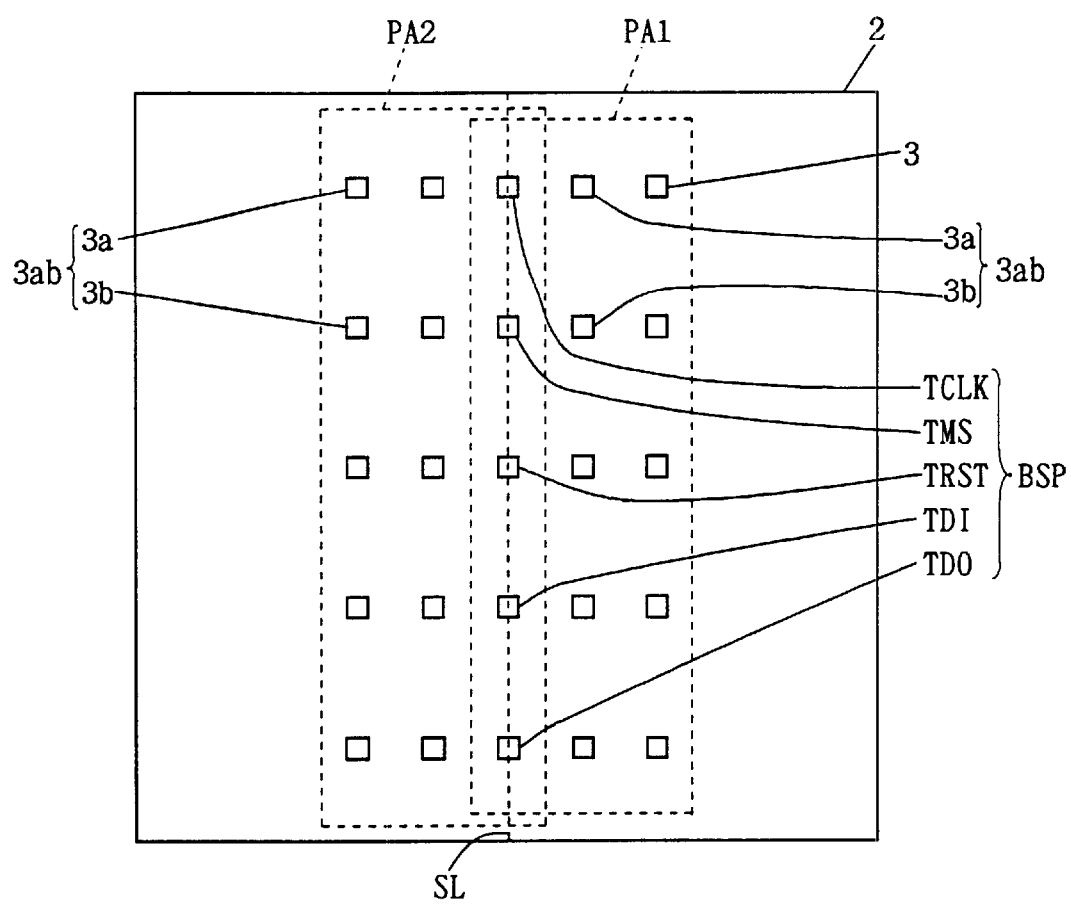
FIG. 13 is a plan view showing an example of a semiconductor device according to a ninth embodiment of the present invention.

FIG. 13 is a plan view showing a semiconductor device according to a ninth embodiment of the present invention.

In FIG. 13, two probing areas PA1 and PA2 are provided. The probing area PA1 includes a pad matrix of 5 (the number of pads 3 in a longitudinal direction of a principal plane 2 of a semiconductor substrate)×3 (the number of the pads 3 in a transverse direction). A segment SL passes through five leftmost pads 3 in the probing area PA1. The five leftmost pads 3 and five rightmost pads 3 in the probing area PA1 have the same arrangement. The probing area PA2 includes a pad matrix which is obtained by copying the pad matrix of the probing area PA1 onto a left side. In other words, the pads 3 in the probing areas PA1 and PA2 have the same arrangement. The five leftmost pads 3 in the probing area PA1 and the five rightmost pads 3 in the probing area PA2 overlap with each other. A region (common region) on the segment SL is used for the probing areas PA1 and PA2 in common. According to the arrangement of the pads 3, when the principal plane 2 of the semiconductor substrate is moved from the probing area PA1 toward the probing area PA2, the pad matrix of the probing area PA1 overlaps with that of the probing area PA2.

Furthermore, two sets of driving pads 3ab are provided corresponding to the probing areas PA1 and PA2, and are included in the respective probing areas PA1 and PA2 in FIG. 13. A set of boundary scanning pads BSP are provided in the common region. Consequently, even if a probe card 4 is caused to come in contact with any of the probing areas PA1 and PA2, a tip of a probe needle 5 always comes in contact with the driving pads 3ab and the boundary scanning pads BSP.

Although a method for testing the semiconductor device shown in FIG. 13 is the same as described in the first embodiment, the principal plane 2 of the semiconductor substrate is not rotated but is moved from the probing area PA1 toward the probing area PA2.

The ninth embodiment has the following effect. Since the tip of the probe needle 5 comes in contact with the driving pads 3ab, the boundary scanning pads BSP and the pads 3 to be tested in a test for each probing area, a function test and a DC test including an output voltage test can be performed completely.

A set of boundary scanning pads BSP are included in the common region. Consequently, it is sufficient that a set of boundary scanning pads BSP are provided on the principal plane 2 of the semiconductor substrate. For example, the number of the boundary scanning pads BSP can be reduced as compared with the first embodiment.

Furthermore, if a set of boundary scanning pads BSP are provided, the selector 11 shown in FIG. 3 can be omitted, for example.

Tenth Embodiment

FIG. 14 is a plan view showing a semiconductor device according to a tenth embodiment of the present invention.

FIG. 14 is obtained by further adding pads 3 to FIG. 13 in such a manner that an arrangement of the pads 3 in a probing area PA1 is the same as that of the pads 3 in a probing area PA2. FIG. 14 is characterized in that driving pads 3ab are provided on a segment SL.

In addition to the effect of the ninth embodiment, the tenth embodiment has an effect that the driving pads 3ab are provided in a common region, resulting in a reduction in the number of the driving pads 3ab.

Eleventh Embodiment

Figure 15:
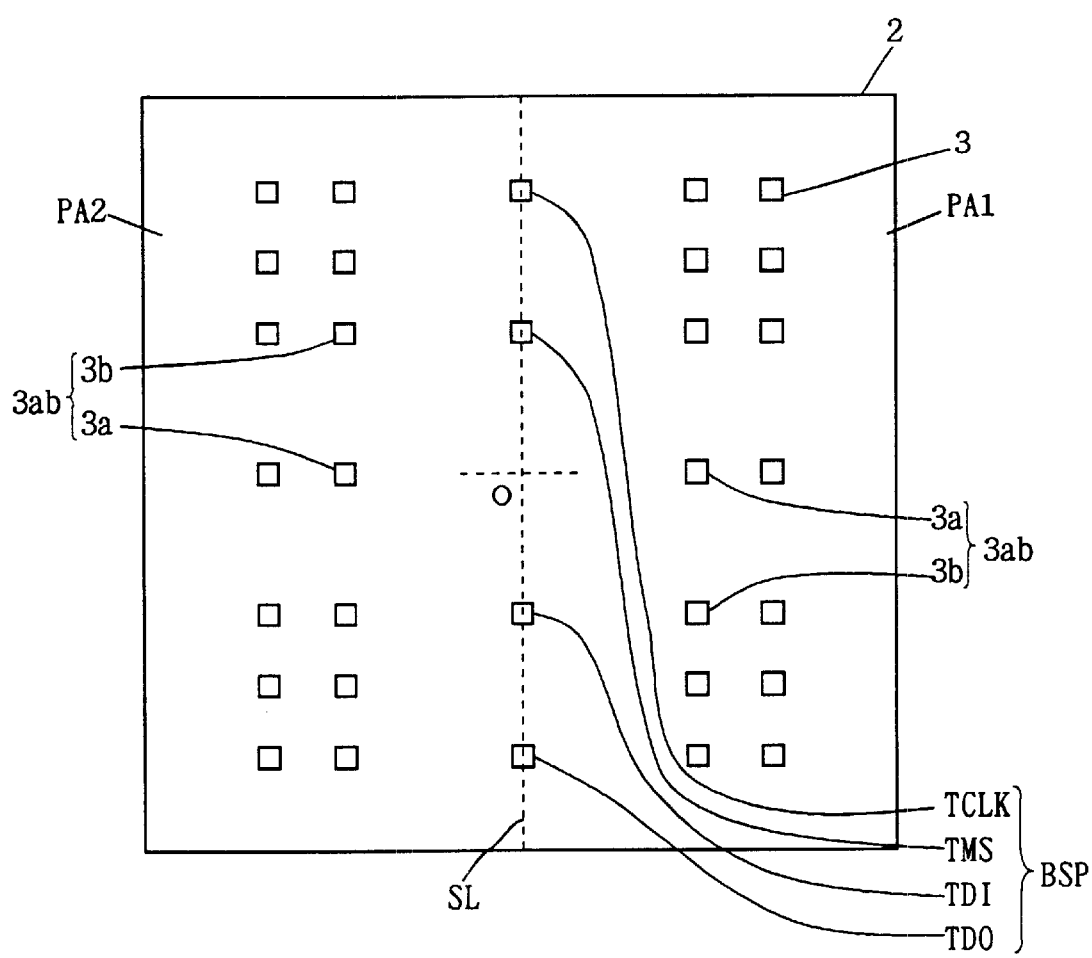
FIG. 15 is a plan view showing an example of a semiconductor device according to an eleventh embodiment of the present invention.

FIG. 15 is a plan view showing a semiconductor device according to an eleventh embodiment of the present invention.

In FIG. 15, O denotes a center of a principal plane 2 of a semiconductor substrate. A segment SL passes through the center O. Probing areas PA1 and PA2 virtually divide the principal plane 2 of the semiconductor substrate by the segment SL A region (common region) on the segment SL is used for the probing areas PA1 and PA2 in common. A pad TCLK and a pad TDO are provided symmetrically with respect to the center O in positions on the segment SL at equal distances from the center O, respectively. A pad TMS and a pad TDI are provided symmetrically with respect to the center O in positions on the segment SL at equal distances from the center O, respectively. Other pads 3 which are not provided on the segment SL are also placed symmetrically around the center O. According to the arrangement of the pads 3, when the principal plane 2 of the semiconductor substrate is rotated by 180 degrees around the center O, the pads 3 overlap with each other. Therefore, the arrangement of the pads 3 is not changed before and after the principal plane 2 of the semiconductor substrate is rotated by 180 degrees.

In FIG. 15, furthermore, two sets of driving pads 3ab are provided corresponding to the probing areas PA1 and PA2, and are included in the respective probing areas PA1 and PA2. Consequently, even if a probe card 4 is caused to come in contact with any of the probing areas PA1 and PA2, a tip of a probe needle 5 always comes in contact with the driving pads 3ab and boundary scanning pads BSP.

Although a method for testing the semiconductor device shown in FIG. 15 is the same as described in the first embodiment, the principal plane 2 of the semiconductor substrate is not rotated by 90 degrees but by 180 degrees.

As in the sixth embodiment, for example, one of the pads 3 included in the boundary scanning pads BSP may be placed on the center O.

The eleventh embodiment has the following effect. Since the tip of the probe needle 5 is in contact with the driving pads 3ab, the boundary scanning pads BSP and the pads 3 to be tested in a test for each probing area, a function test and a DC test including an output voltage test can be performed completely.

A set of boundary scanning pads BSP are included in the common region. Consequently, it is sufficient that a set of boundary scanning pads BSP are provided on the principal plane 2 of the semiconductor substrate. For example, the number of the boundary scanning pads BSP can be reduced as compared with the first embodiment.

Furthermore, if a set of boundary scanning pads BSP are provided, the selector 11 shown in FIG. 3 can be omitted, for example.

Twelfth Embodiment

Figure 16:
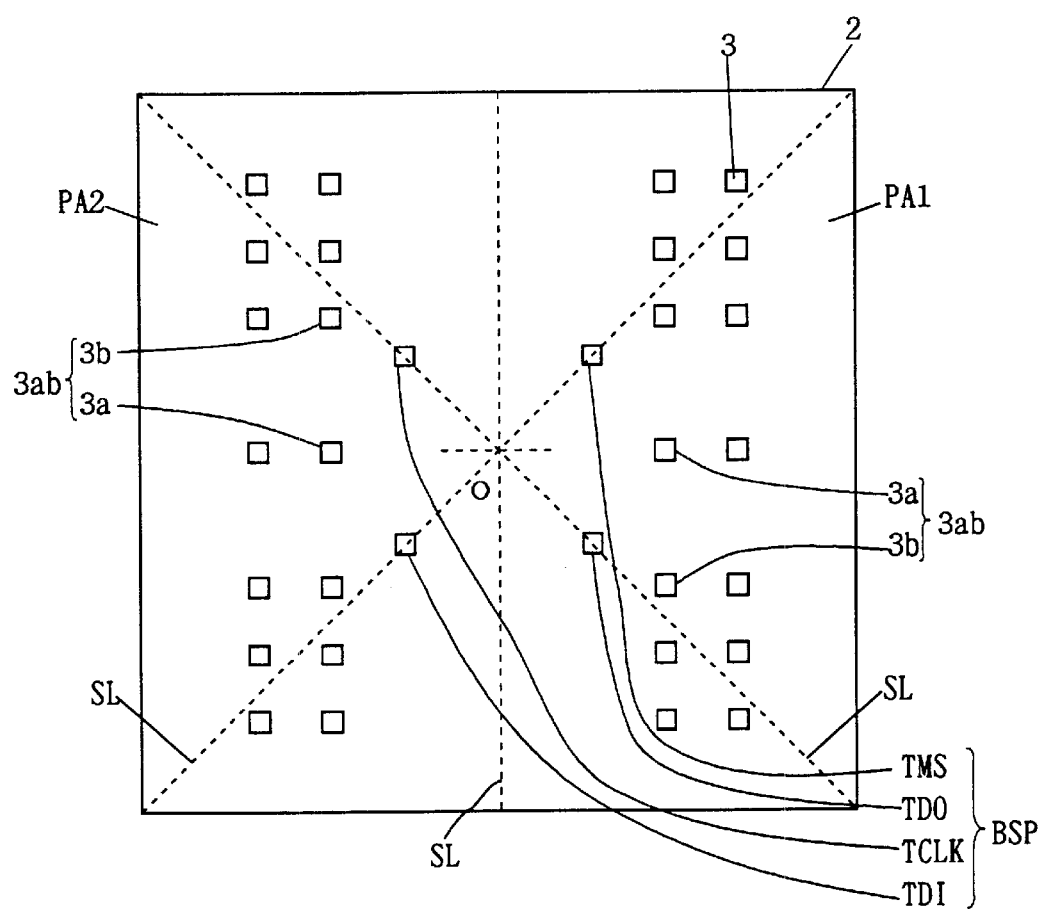
FIG. 16 is a plan view showing an example of a semiconductor device according to a twelfth embodiment of the present invention.

FIG. 16 is a plan view showing a semiconductor device according to a twelfth embodiment of the present invention.

FIG. 16 is obtained by further adding, to FIG. 15, two orthogonal segments SL whose intersection overlaps with a center O and by moving boundary scanning pads BSP onto the added two orthogonal segments SL.

An arrangement of pads TMS, TCLK, TDO and TDI is the same as in FIG. 8. Even if pads 3 are thus arranged, a principal plane 2 of a semiconductor substrate is rotated by 180 degrees around the intersection O in the same manner as in FIG. 15 so that the pads 3 overlap with each other. Therefore, the arrangement of the pads 3 is not changed before and after the principal plane 2 of the semiconductor substrate is rotated by 180 degrees.

As in the sixth embodiment, for example, one of the pads 3 included in the boundary scanning pads BSP may be placed on the intersection O.

Figure 17:
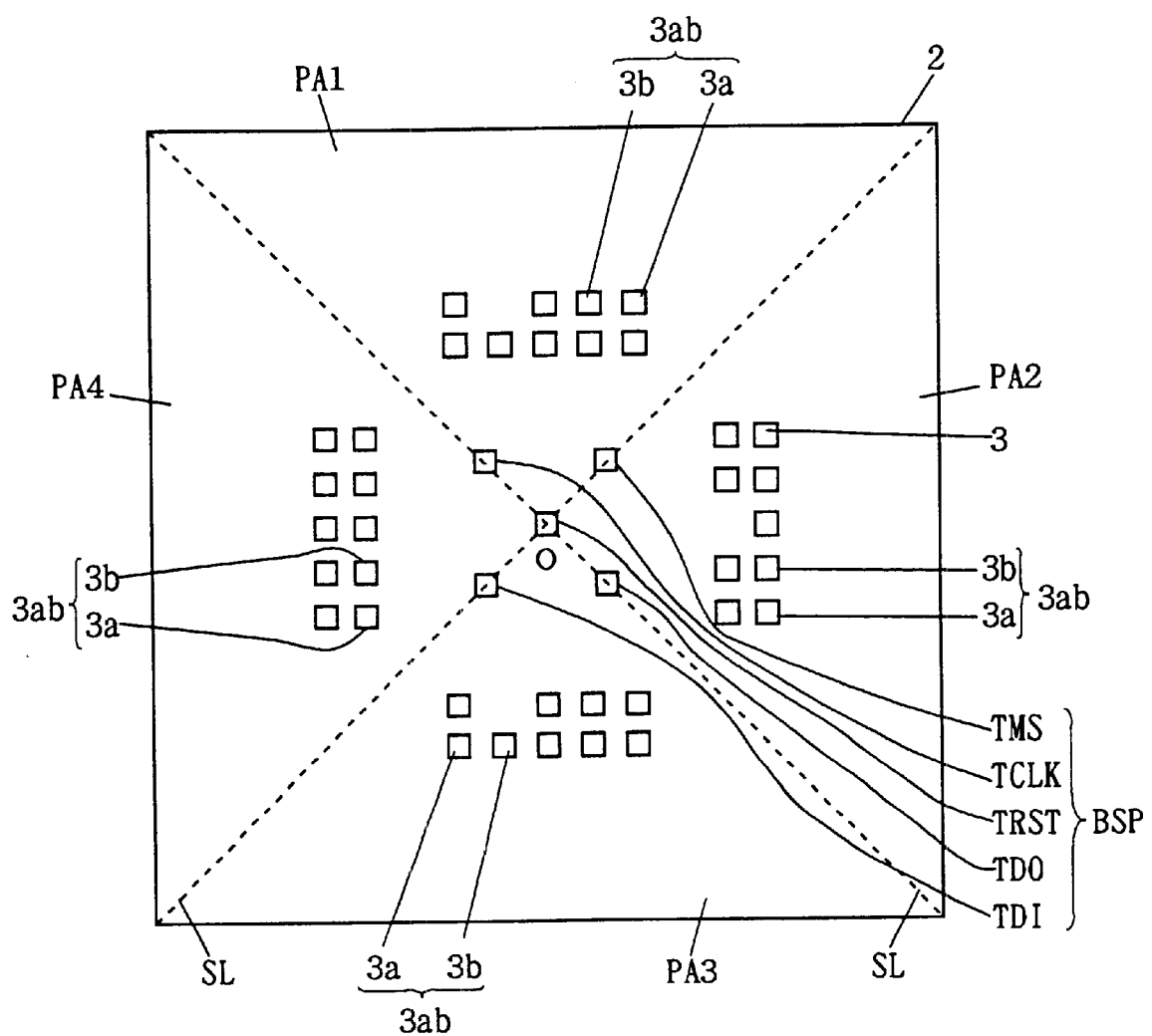
FIG. 17 is a plan view showing an example of a semiconductor device according to a thirteenth embodiment of the present invention.

In addition to the effect of the eleventh embodiment, the effect of the twelfth embodiment is effective in a case where it is hard to place the boundary scanning pads BSP on one segment SL Thirteenth Embodiment A thirteenth embodiment is applied to the first to twelfth embodiments. For example, the number of pads 3 in probing areas PA1 to PA4 is sometimes varied as shown in FIG. 17. In this case, a probe card 4 may form a probe needle 5 in such a manner that the probe needle 5 comes in contact with all pads 3 in the probing area PA4, for example. However, in a case where the probe card 4 is caused to come in contact with the probing area PA1, the probe needle 5 comes in contact with a principal plane 2 of a semiconductor substrate other than the pads 3 and sometimes damages the principal plane 2 of the semiconductor substrate other than the pads 3, for example.

Figure 18:
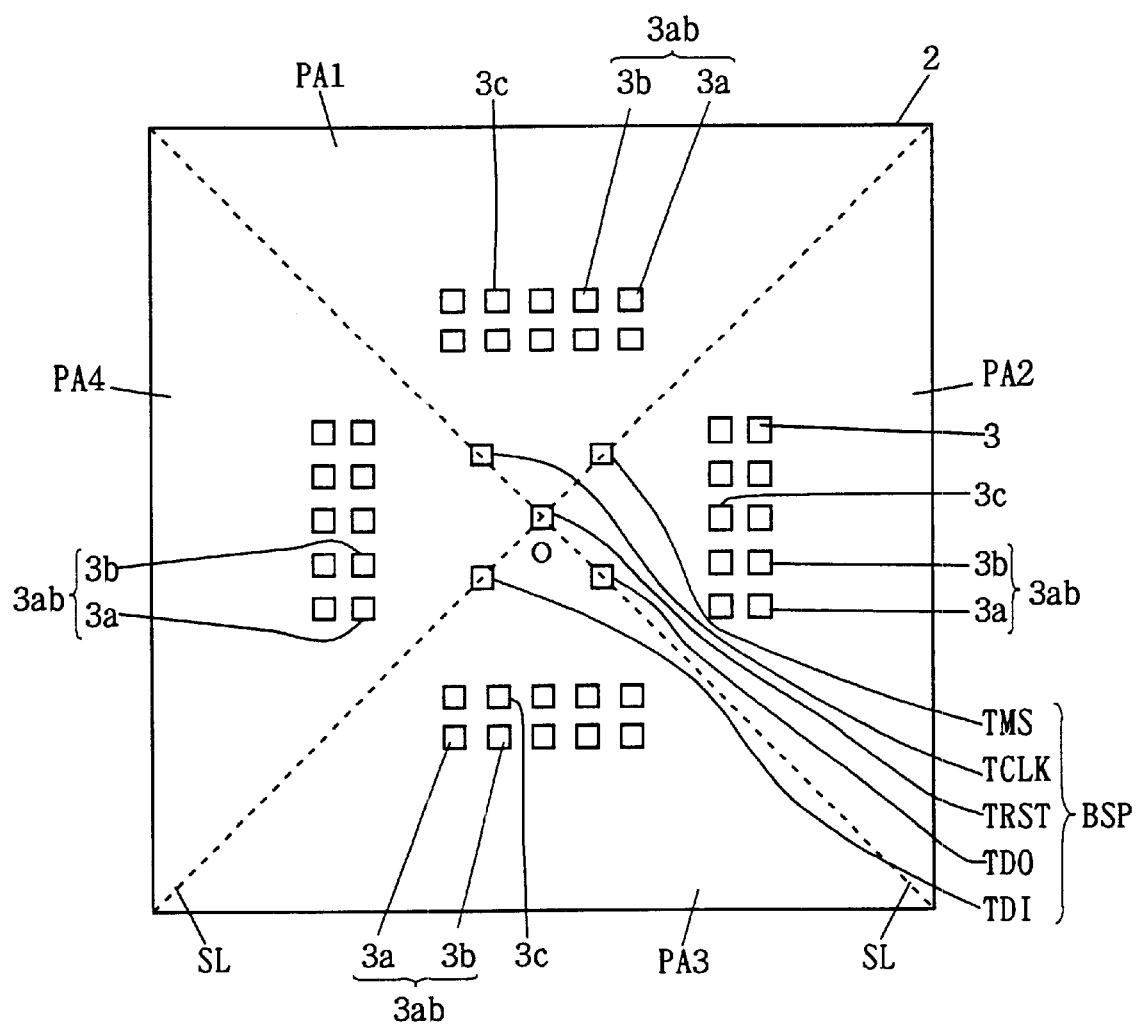
FIG. 18 is a plan view showing an example of the semiconductor device according to the thirteenth embodiment of the present invention.
Figure 19A:
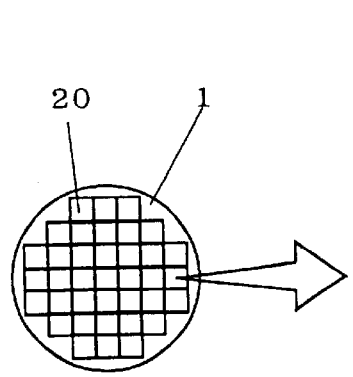
FIG. 19 is a plan view showing a semiconductor device according to the prior art.
Figure 19B:
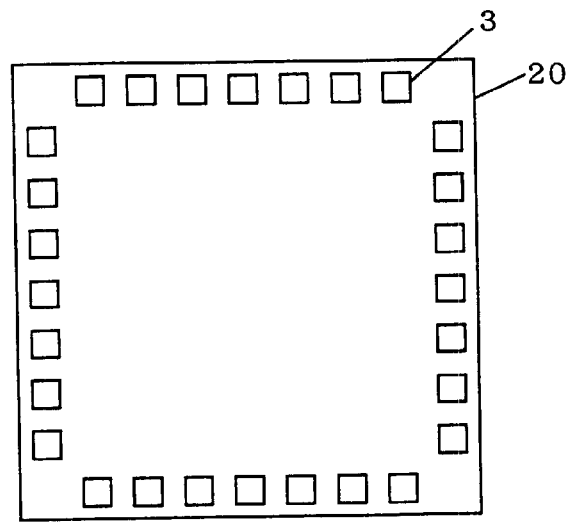
Figure 20A:
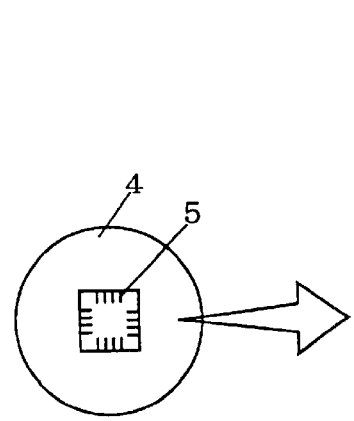
FIG. 20 is a view showing an example of a probe card according to the prior art.
Figure 20B:
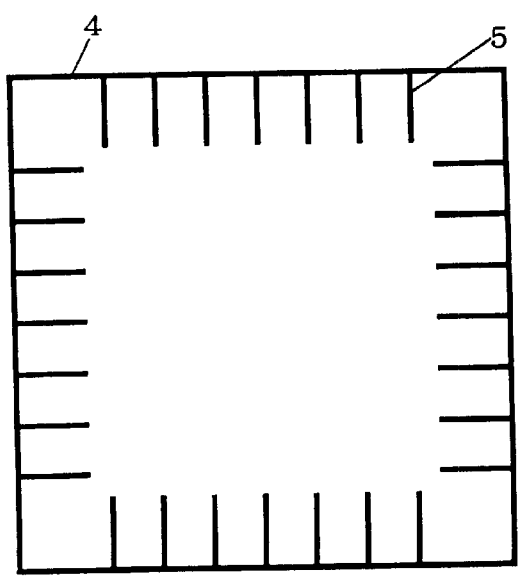
Figure 21:
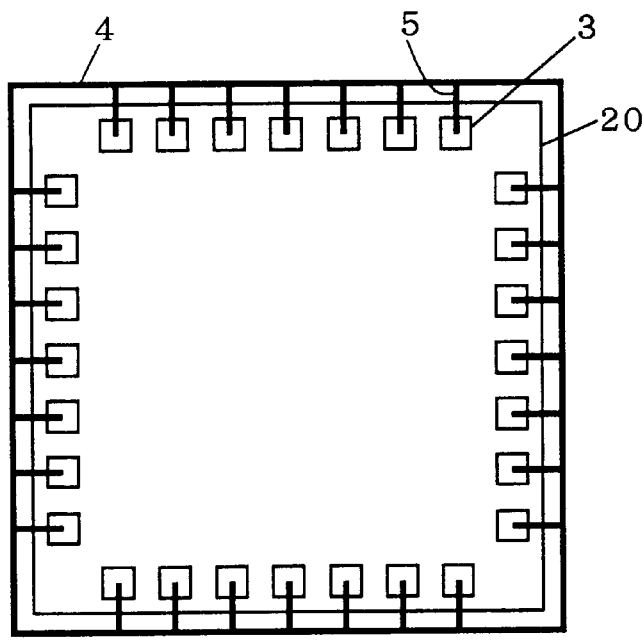
FIG. 21 is a view showing an example of a state in which the probe card is in contact with the semiconductor device according to the prior art.
Figure 22:
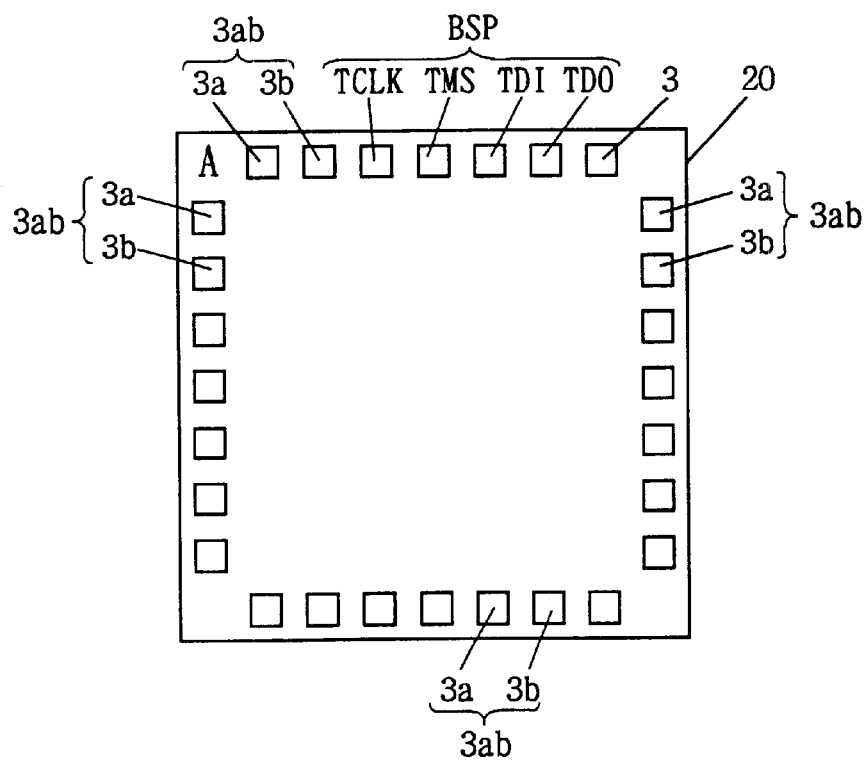
FIG. 22 is a plan view showing the semiconductor device according to the prior art.

As shown in FIG. 18, a dummy pad 3c is provided to make arrangements of the pads 3 identical to each other in the probing areas PA1 to PA4.

The twelfth embodiment has the following effect. Since the dummy pad 3c is provided, the probe needle 5 can be prevented from damaging the principal plane 2 of the semiconductor substrate other than the pads 3.

Variant

It is preferable that the number of probe needles 5 provided on a probe card 4 should be at least the same as the maximum number of pads 3 included in each probing area. The number of the probing areas may be 3 or 5 or more. Furthermore, other test jigs can be used in place of the probe card 4 and the probe needle 5.

In FIGS. 8, 10 and 13, plural sets of driving pads 3ab may be placed in identical positions in the probing areas.

While the invention has been described in detail, the foregoing description is in all aspects illustrative and not restrictive. It is understood that numerous other modifications and variations can be devised without departing from the scope of the invention.

I claim:

1. A semiconductor device comprising:

a semiconductor substrate provided with a boundary scan test circuit having an I/O pad selecting function; and a plurality of pads provided on a principal plane of said semiconductor substrate and conducted to the boundary scan test circuit, said principal plane of said semiconductor substrate having a plurality of areas with each of which a test jig comes in contact, said plurality of areas including said plurality of pads, said I/O pad selecting function functioning to select at least one pad included in one area from said plurality of areas, said pads including:

at least one set of driving pads for supplying a driving voltage of said semiconductor device; and at least one set of boundary scanning pads for performing a boundary scan test, and said at least one set of driving pads and said at least one set of boundary scanning pads being placed in such positions that said test jig can come in contact with one set of said at least one set of driving pads and one set of said at least one et of boundary scanning pads when said test jig comes in contact with any of said areas.

2. The semiconductor device according to claim 1, wherein plural sets of driving pads are provided corresponding to said areas and are included in said respective areas, and plural sets of boundary scanning pads are provided corresponding to said areas and are included in said respective areas.

3. The semiconductor device according to claim 2, wherein said pads included in each of said areas are arranged along a side of said principal plane of said semiconductor substrate.

4. The semiconductor device according to claim 2, wherein said sets of boundary scanning pads are placed in identical positions in said areas.

5. The semiconductor device according to claim 2, wherein said boundary scan test circuit having an I/O pad selecting function includes:

a boundary scanning circuit for performing said boundary scan; and a selector for conducting, to said boundary scanning circuit, any of said plural sets of boundary scanning pads with which said test jig is in contact.

6. The semiconductor device according to claim 1, wherein said areas have a common region to be used for all of them in common, and said one set of boundary scanning pads are included in said common region.

7. The semiconductor device according to claim 6, wherein said areas are four areas obtained by virtually dividing said principal plane of said semiconductor substrate by two orthogonal segments, said common region includes a region on said two orthogonal segments, and said one set of boundary scanning pads are placed in positions on said two orthogonal segments at equal distances from an intersection of said two orthogonal segments.

8. The semiconductor device according to claim 7, wherein said common region further includes at least one region on other two orthogonal segments whose intersection is positioned on said intersection of said two orthogonal segments, and said at least one set of driving pads are placed in positions on said other two orthogonal segments at equal distances from said intersection.

9. The semiconductor device according to claim 7, wherein one pad included in said one set of boundary scanning pads is placed on said intersection.

10. The semiconductor device according to claim 6, wherein said areas are two areas obtained by virtually dividing said principal plane of said semiconductor substrate by one segment, and said common region includes a region on said one segment.

11. The semiconductor device according to claim 10, wherein said one set of boundary scanning pads are placed on said one segment which is symmetrical with respect to a predetermined point on said one segment.

12. The semiconductor device according to claim 6, wherein said areas are two areas obtained by virtually dividing said principal plane of said semiconductor substrate by one segment, said common region includes a region on two orthogonal segments whose intersection is positioned on said one segment, and said one set of boundary scanning pads are placed in positions on said two orthogonal segments at equal distances from said intersection of said two orthogonal segments.

13. The semiconductor device according to claim 6, wherein said at least one set of driving pads are included in said common region.

14. The semiconductor device according to claim 1, wherein plural sets of driving pads are provided corresponding to said areas, and are included in said respective areas, and said plural sets of driving pads are placed in identical positions in said areas.

15. The semiconductor device according to claim 1, wherein said pads further include a dummy pad for making arrangements of said pads identical to each other in said areas.

16. A semiconductor device comprising:

a semiconductor substrate provided with a boundary scan circuit including a boundary scan register forming one scan path; and a plurality of groups of pads, as to a position relation of pads belonging to each group of pads, being identical with one another, the pads belonging to each group of pads include a plurality of boundary scanning pads used for boundary scanning of said boundary scan circuit, and a plurality of other pads, wherein said boundary scanning pads include a first pad for supplying a signal to an input of said scan path, and a second pad for receiving a signal from an output of said scan path, wherein said boundary scan circuit further includes a selector connected to boundary scan register, said selector selecting one first pad of said plurality of groups of pads and selecting one second pad of said plurality of groups of pads to connect the selected first pad and the selected second pad to an input and an output of said scan path, respectively.

17. The semiconductor device of claim 16, wherein said boundary scanning pads further include:

a third pad for supplying a clock signal to said boundary scan circuit; and a fourth pad for providing a test mode signal with said boundary scan circuit.

18. The semiconductor device of claim 16, wherein said plurality of other pads includes driving pads for supplying driving voltages of said device.

19. The semiconductor device of claim 16, wherein said boundary scanning pads further includes a third pad connected to said selector and receiving a control signal for selecting one of the first pads and one of the second pads in said plurality of groups of pads.

20. The semiconductor device of claim 19, wherein:

said boundary scan circuit further includes a tap controller for controlling said boundary scan register in accordance with said control signal received at each third pad.

21. A semiconductor device comprising:

a semiconductor substrate provided with a boundary scan circuit including a boundary scan register forming one scan path; and a plurality of groups of pads provided on a principal plane of said semiconductor substrate, each of said groups of pads includes plural pads; and a common group of pads provided on a principal plane of said semiconductor substrate, including plural pads having at least boundary scanning pads used for boundary scanning of said boundary scan circuit, wherein a position relation among pads belonging to said common group of pads and each of said plurality of groups of pads is identical with that belonging to said common group of pads and another group of pads.

22. The semiconductor device of claim 21, wherein said plural pads in said common group of pads includes at least four pads arranged on a circumference of a virtual circle.

23. The semiconductor device of claim 22, wherein said plural pads in said common group of pads includes further one pad arranged on a center of the virtual circle.

24. The semiconductor device of claim 22, wherein said plural pads in said common group of pads includes more than five pads arranged on a circumference of a virtual circle, a first group of pads among said plural pads arranged on a first virtual straight line and a second group of pads among said plural pads arranged on a second virtual straight line orthogonal to the first virtual straight line.

25. The semiconductor device of claim 22, wherein a first group of pads among said plural pads arranged on a first virtual straight line, a second group of pads among said plural pads arranged on a second virtual straight line orthogonal to the first virtual straight line, a third group of pads among said plural pads arranged on a third virtual straight line different from the first and second virtual straight lines, and a fourth groups of pads among said plural pads arranged on a fourth virtual straight line orthogonal to the third virtual straight line.

26. The semiconductor device of claim 21, wherein said plural pads in said common group of pads include at least four pads arranged on a virtual straight line.

27. The semiconductor device of claim 21, wherein said boundary scanning pads include a first pad connected to an input of said scan path, a second pad connected to an output of said scan path, a third pad for providing a clock signal with said boundary scan circuit, and a fourth pad for providing a test mode signal with said boundary scan circuit.

28. The semiconductor device of claim 27, wherein said boundary scanning pads further include a fifth pad receiving a reset signal for resetting said boundary scan circuit.

29. The semiconductor device of claim 21, wherein said plural pads in said common group of pads further include driving pads for supplying driving voltage of said device.

* * * * *

UNITED STATES PATENT AND TRADEMARK OFFICE
CERTIFICATE OF CORRECTION

PATENT NO. : 6,351,836 B1 Page 1 of 1
DATED : February 26, 2002
INVENTOR(S) : Tsujii It is certified that error appears in the above-identified patent and that said Letters Patent is hereby corrected as shown below:

<u>Title page, Item [54] and Column 1, lines 1 and 2,</u>
Title, should read as follows:

-- [54] SEMICONDUCTOR DEVICE WHERE POSITIONAL RELATIONSHIP AMONG PADS BELONGING TO A COMMON GROUP OF PADS AND EACH OF THE PLURALITY OF GROUPS OF PADS IS IDENTICAL --

Signed and Sealed this

Twenty-ninth Day of October, 2002

*Attest:*

*Attesting Officer*

JAMES E. ROGAN
*Director of the United States Patent and Trademark Office*